(12) United States Patent
Hsieh et al.

(10) Patent No.: US 12,021,105 B2
(45) Date of Patent: Jun. 25, 2024

(54) PIXEL ARRAY INCLUDING OCTAGON PIXEL SENSORS

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 213 days.

(21) Appl. No.: 16/949,924

(22) Filed: Nov. 20, 2020

(65) Prior Publication Data
US 2022/0165779 A1    May 26, 2022

(51) Int. Cl.
*H01L 27/146* (2006.01)
*G01N 21/359* (2014.01)

(52) U.S. Cl.
CPC ..... *H01L 27/14643* (2013.01); *G01N 21/359* (2013.01); *H01L 27/14621* (2013.01); *H01L 27/14603* (2013.01); *H01L 27/14627* (2013.01)

(58) Field of Classification Search
CPC ........ H01L 27/14643; H01L 27/14621; G01N 21/359
See application file for complete search history.

(56) References Cited

U.S. PATENT DOCUMENTS

| 10,090,347 | B1 * | 10/2018 | Mlinar | H01L 27/14627 |
| 2013/0038689 | A1 * | 2/2013 | McDowall | G02B 27/0075 348/45 |

(Continued)

FOREIGN PATENT DOCUMENTS

| CN | 107615485 A | 1/2018 |
| TW | 201716807 A | 5/2017 |
| TW | 201841005 A | 11/2018 |

OTHER PUBLICATIONS

Sharp presents Quattron LCD TV technology in TV commercials, Press Release, Sharp, pp. 1-2 (Year: 2010) https://secure.sharp.eu/sharp/assets/internet/assets/images/pm_tv_spot_quattron_2010_4.2.en.pdf.*

(Continued)

*Primary Examiner* — William B Partridge
*Assistant Examiner* — David Paul Sedorook
(74) *Attorney, Agent, or Firm* — Harrity & Harrity, LLP

(57) ABSTRACT

A pixel array includes octagon-shaped pixel sensors and square-shaped pixel sensors. The octagon-shaped pixel sensors may be interspersed in the pixel array with square-shaped pixel sensors to increase the utilization of space in the pixel array, and to allow for pixel sensors in the pixel array to be sized differently. Moreover, the pixel array may include a combination of red, green, and blue pixel sensors to obtain color information from incident light; yellow pixel sensors for blue and green color enhancement and correction for the pixel array; near infrared (NIR) pixel sensors to increase contour sharpness and low light performance for the pixel array; and/or white pixel sensors to increase light sensitivity and brightness for the pixel array. The capability to configure different sizes and types of pixel sensors permits the pixel array to be formed and/or configured to satisfy various performance parameters.

20 Claims, 32 Drawing Sheets

(56) References Cited

U.S. PATENT DOCUMENTS

| | | | |
|---|---|---|---|
| 2014/0333899 A1* | 11/2014 | Smithwick | G03B 21/00 353/10 |
| 2016/0126295 A1* | 5/2016 | Sato | H10K 59/353 257/89 |
| 2016/0150199 A1* | 5/2016 | Wu | H04N 25/135 348/279 |
| 2018/0007324 A1* | 1/2018 | Chen | H04N 25/585 |
| 2018/0041723 A1* | 2/2018 | Mabuchi | H04N 25/77 |
| 2018/0277580 A1* | 9/2018 | Chiang | H01L 27/14645 |
| 2019/0383725 A1* | 12/2019 | Petersen | G01N 15/1429 |

OTHER PUBLICATIONS

Sharp presents Quattron LCD TV technology in TV commercials, Press Release, Sharp, pp. 1-2 http://secure.sharp.eu/sharp/assetts/internet/assets/images/pm_tv_spot_quattron_2010_4.2.en.pdf (Year: 2010).*

Sharp presents Quattron LCD TV technology in TV commercials, Press Release, Sharp, pp. 1-2 https://secure.sharp.eu/sharp/assets/internet/assets/images/pm_tv)spot_quattron_2010_4.2.en.pdf (Year: 2010).*

* cited by examiner

3200 ⟶

3210 — Form a plurality of octagon-shaped pixel sensors of a pixel array to include, a first set of octagon-shaped pixel sensors configured to sense incident light in a first visible light wavelength range associated with blue light, a second set of octagon-shaped pixel sensors configured to sense incident light in a second visible light wavelength range associated with red light, a third set of octagon-shaped pixel sensors configured to sense incident light in a third visible light wavelength range associated with green light, and at least one of a fourth set of octagon-shaped pixel sensors configured to sense incident light in a fourth visible light wavelength range associated with yellow light, a fifth set of octagon-shaped pixel sensors configured to sense incident light for all visible light wavelengths, or a sixth set of octagon-shaped pixel sensors configured to sense incident light in a near infrared (NIR) wavelength range 3220 — Form a plurality of square-shaped pixel sensors, interspersed with the plurality of octagon-shaped pixel sensors in the pixel array, to include, a first set of square-shaped pixel sensors configured to sense incident light in the first visible light wavelength range associated with blue light, a second set of square-shaped pixel sensors configured to sense incident light in the second visible light wavelength range associated with red light, a third set of square-shaped pixel sensors configured to sense incident light in the third visible light wavelength range associated with green light, and at least one of a fourth set of square-shaped pixel sensors configured to sense incident light in the fourth visible light wavelength range associated with yellow light, a fifth set of square-shaped pixel sensors configured to sense incident light for all visible light wavelengths, or a sixth set of square-shaped pixel sensors configured to sense incident light in the NIR wavelength range

FIG. 32

PIXEL ARRAY INCLUDING OCTAGON PIXEL SENSORS

BACKGROUND

Complementary metal oxide semiconductor (CMOS) image sensors utilize light-sensitive CMOS circuitry, referred to as pixel sensors, to convert light energy into electrical energy. A pixel sensor typically includes a photodiode formed in a silicon substrate. As the photodiode is exposed to light, an electrical charge is induced in the photodiode. The photodiode may be coupled to a switching transistor, which is used to sample the charge of the photodiode. Colors may be determined by placing color filters over photodiodes of a CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 32 is a flowchart of an example process relating to forming an image sensor described herein.

DETAILED DESCRIPTION

Figure 1:
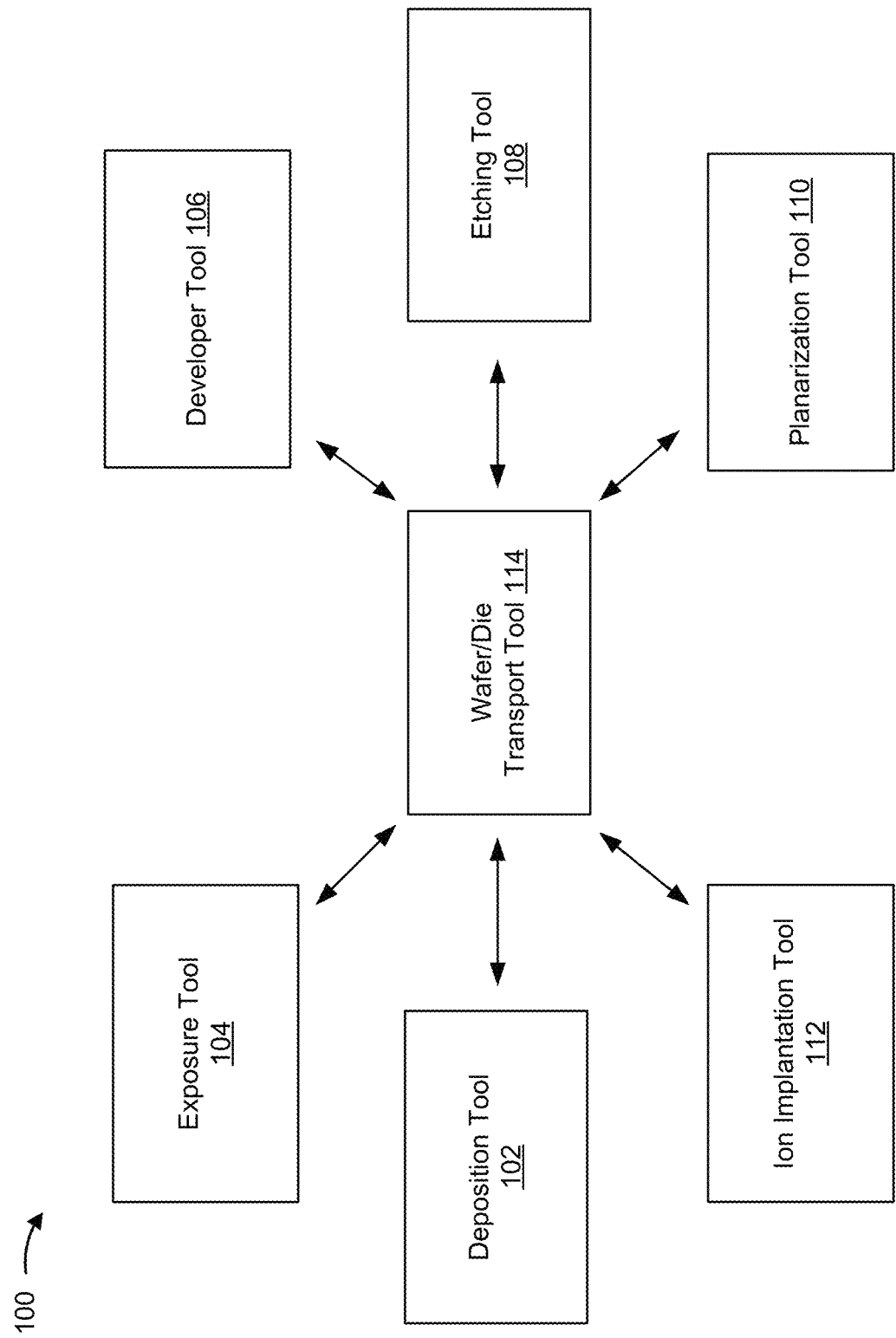
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a complementary metal oxide semiconductor (CMOS) image sensor, incident light received by pixel sensors of the CMOS image sensor is often separated into the three primary colors of visible light: red, green, and blue (RGB). This type of CMOS image sensor may be referred to an RGB image sensor. In an RGB image sensor, respective pixel sensors that sense a particular color of visible light can be defined through the use of a color filter that passes a wavelength range of visible light for a particular color to pass into a photodiode. In low light conditions (e.g., where the availability of visible light is scarce, such as low indoor lighting or at night), RGB image sensors may suffer from poor image quality (e.g., image noise, poor contrast, poor color saturation) because the pixel sensors are not able to capture an adequate amount of red, green, and blue color luminance.

Some implementations described herein provide techniques and apparatuses for a pixel array that includes octagon-shaped pixel sensors and square-shaped pixel sensors. The octagon-shaped pixel sensors may be interspersed in the pixel array with square-shaped pixel sensors to increase the utilization of space in the pixel array, and to allow for pixel sensors in the pixel array to be sized differently. Moreover, the pixel array may include a combination of red, green, and blue pixel sensors to obtain color information from incident light; yellow pixel sensors for blue and green color enhancement and correction for the pixel array; near infrared (NIR) pixel sensors to increase contour sharpness and low light performance for the pixel array; and/or white pixel sensors to increase light sensitivity and brightness for the pixel array. The capability to configure different sizes and types of pixel sensors permits the pixel array to be formed and/or configured to satisfy various performance parameters, such as color saturation, color accuracy, noise, contrast, brightness, hue and saturation, light sensitivity, and contour sharpness.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etching tool 108, a planarization tool 110, an ion implantation tool 112, and/or another type of semiconductor processing tool. The plurality of semiconductor processing tools 102-112 included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

The ion implantation tool 112 is a semiconductor processing tool that is used to implant ions into a substrate. The ion implantation tool 112 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 114 includes a mobile robot, a robot arm, a tram or rail car, and/or another type of device that are used to transport wafers and/or dies between semiconductor processing tools 102-112 and/or to and from other locations such as a wafer rack, a storage room, and/or the like. In some implementations, wafer/die transport tool 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
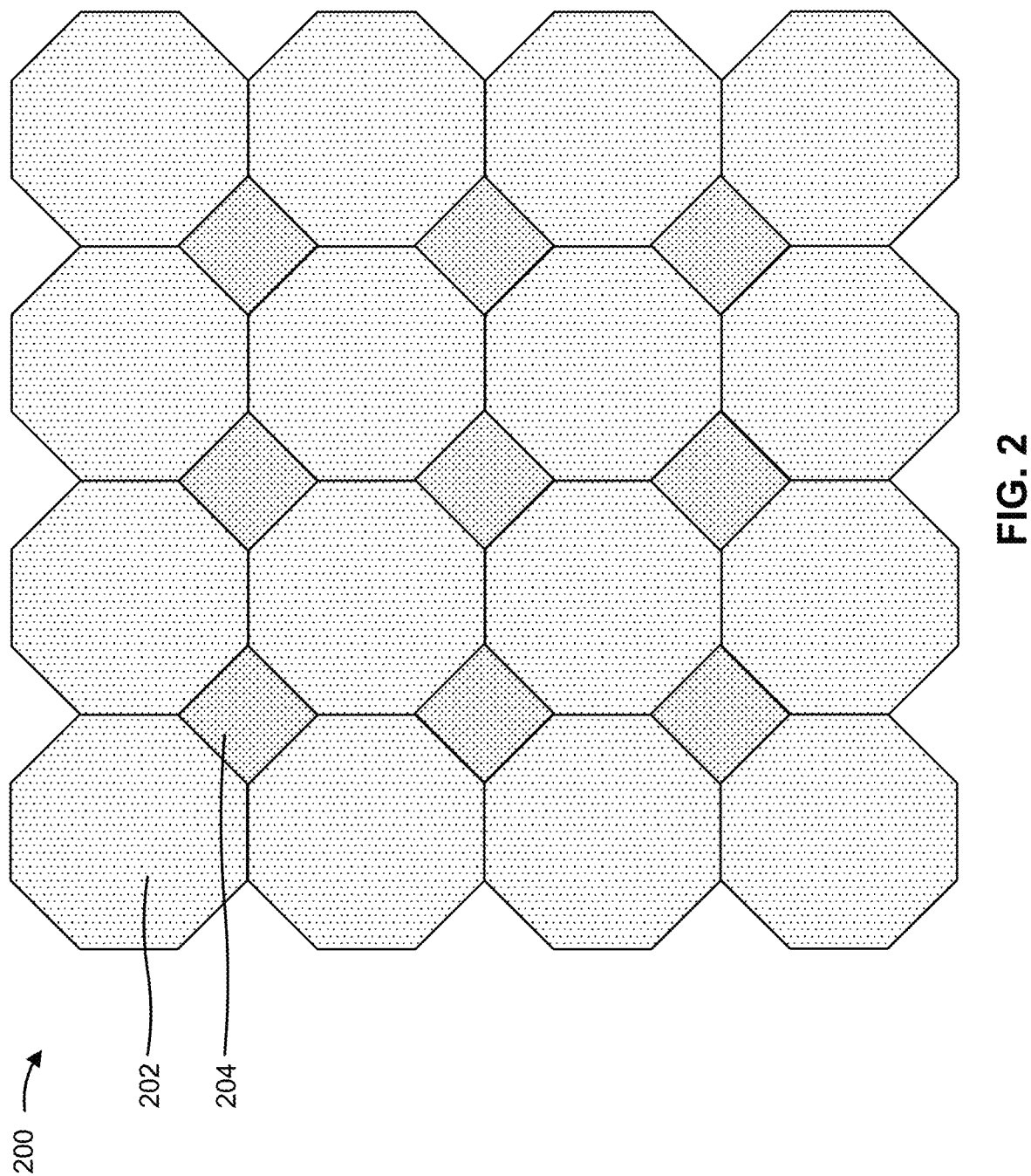
FIG. 2 is a diagram of an example pixel array described herein.

FIG. 2 is a diagram of an example pixel array 200 described herein. In some implementations, the pixel array 200 may be included in an image sensor. The image sensor may be a CMOS image sensor, a backside illumination (BSI) CMOS image sensor, or another type of image sensor. As shown in FIG. 2, the pixel array 200 may include a plurality of octagon-shaped pixel sensors 202 and a plurality of square-shaped pixel sensors 204. The octagon-shaped pixel sensors 202 and the square-shaped pixel sensors 204 may be interspersed, intermixed, and/or distributed throughout the pixel array 200.

As shown in FIG. 2, a square-shaped pixel sensor 204 may be disposed between and/or surrounded by a subset of octagon-shaped pixel sensors 202 (e.g., 4 octagon-shaped pixel sensors 202) such that the sides of the octagon-shaped pixel sensors 202 align with the sides of the square-shaped pixel sensors 204. This reduces and/or minimizes unused gaps or portions between the pixel sensors of the pixel array 200, which increases the pixel sensor density of the pixel array 200 and increases spatial utilization in the pixel array 200.

Moreover, this particular arrangement permits the length of the sides of the octagon-shaped pixel sensors 202 to be adjusted to increase or decrease the size of the square-shaped pixel sensors 204 while maintaining the tight grouping of pixel sensors in the pixel array 200. For example, the length of the sides of octagon-shaped pixel sensors 202 facing a square-shaped pixel sensor 204 may be decreased to correspondingly decrease the size of the square-shaped pixel sensor 204. As another example, the length of the sides of octagon-shaped pixel sensors 202 facing a square-shaped pixel sensor 204 may be increased to correspondingly increase the size of the square-shaped pixel sensor 204. In addition, this particular arrangement permits the square-shaped pixel sensors 204 to be used with regular octagon-shaped pixel sensors (e.g., octagon-shaped pixel sensors having all sides the same length) and/or irregular octagon-shaped pixel sensors (e.g., octagon-shaped pixel sensors having two or more sides of different lengths).

As indicated above, FIG. 2 is provided as an example. Other examples may differ from what is described with regard to FIG. 2.

FIGS. 3-30 are diagrams of example pixel sensor configurations described herein. In particular, FIGS. 3-30 illustrate example arrangement configurations for a plurality of octagon-shaped pixel sensors 202 and a plurality of square-shaped pixel sensors 204 for the pixel array 200 (or a portion thereof).

As shown in FIGS. 3-30, the example pixel sensor configurations include various combinations of red pixel sensors, green pixel sensors, blue pixel sensors, yellow pixel sensors, NIR pixel sensors, and/or white pixel sensors. The red pixel sensors, green pixel sensors, and blue pixel sensors may each be formed and/or configured to sense a wavelength range of incident light associated with a respective color of visible light. For example, the red light pixel sensors may be visible light pixel sensors that are formed and/or configured to sense a wavelength range of incident light corresponding to a red component of visible light (e.g., to provide red color information for the incident light), the green light pixel sensors may be visible light pixel sensors that are formed and/or configured to sense a wavelength range of incident light corresponding to a green component of visible light (e.g., to provide green color information for the incident light), and the blue light pixel sensors may be visible light pixel sensors that are formed and/or configured to sense a wavelength range of incident light corresponding to a blue component of visible light (e.g., to provide blue color information for the incident light). The red pixel sensors, green pixel sensors, and blue pixel sensors may obtain primary color information of incident light, which may be used by various components (e.g., processors, transistors, memory, and/or other components) to interpolate the full visible light color spectrum of the incident light based on a demosaicing algorithm.

The yellow pixel sensors may be visible light pixel sensors that are formed and/or configured to sense a wavelength range of incident light corresponding to a yellow component of visible light (e.g., to provide yellow color information for the incident light). Yellow pixel sensors may have greater quantum efficiency performance relative to green pixel sensors and blue pixel sensors, and thus may be capable of sensing a greater amount of luminance relative to green pixel sensors and blue pixel sensors. The yellow color information obtained by the yellow pixel sensors may be used to interpolate additional green color information and/or blue color information to increase the green light performance and/or the blue light performance of the pixel array 200 and/or the image sensor.

The NIR pixel sensors may be formed and/or configured to sense a wavelength of incident light associated with a wavelength of non-visible infrared light near the wavelength range of visible light. For example, an NIR pixel sensor may be formed and/or configured to sense a wavelength range of incident light in a range of approximately 700 nanometers to approximately 1400 nanometers. The electromagnetic radiation emitted by the sun includes a greater amount of infrared light than visible light, and the infrared light emitted by the sun is primarily composed of NIR light. Accordingly, the NIR pixel sensors of the pixel array 200 may be capable of sensing and obtaining a greater amount of luminance information for incident light relative to the visible light pixel sensors. In this way, the NIR pixel sensors of the pixel array 200 may be used to increase the light sensitivity of the pixel array, increase the contour sharpness of images generated by the image sensor, and increase the low light performance of the image sensor.

The white pixel sensors may be pixel sensors that are formed and/or configured to sense the entire wavelength range of visible light or substantially the entire wavelength range of visible light. White pixel sensors may be included in the pixel array 200 to provide baseline luminance information, to increase light sensitivity, and/or to increase brightness performance.

As further shown in FIGS. 3-30, the example pixel sensor configurations include various combinations of octagon-shaped pixel sensors 202 and square-shaped pixel sensors 204 configured as red pixel sensors, green pixel sensors, blue pixel sensors, yellow pixel sensors, NIR pixel sensors, and/or white pixel sensors. The quantities of red pixel sensors, green pixel sensors, blue pixel sensors, yellow pixel sensors, NIR pixel sensors, and/or white pixel sensors included in the example pixel sensor configurations are examples; the quantities of octagon-shaped pixel sensors 202 configured as red pixel sensors, green pixel sensors, blue pixel sensors, yellow pixel sensors, NIR pixel sensors, and/or white pixel sensors in the example pixel sensor configurations are examples; and the quantities of square-shaped pixel sensors 204 configured as red pixel sensors, green pixel sensors, blue pixel sensors, yellow pixel sensors, NIR pixel sensors, and/or white pixel sensors in the example pixel sensor configurations are examples. Other example pixel sensor configurations may include different quantities of red pixel sensors, green pixel sensors, blue pixel sensors, yellow pixel sensors, NIR pixel sensors, and/or white pixel sensors; different quantities of octagon-shaped pixel sensors 202 configured as red pixel sensors, green pixel sensors, blue pixel sensors, yellow pixel sensors, NIR pixel sensors, and/or white pixel sensors; and/or other quantities of square-shaped pixel sensors 204 configured as red pixel sensors, green pixel sensors, blue pixel sensors, yellow pixel sensors, NIR pixel sensors, and/or white pixel sensors.

Figure 3:
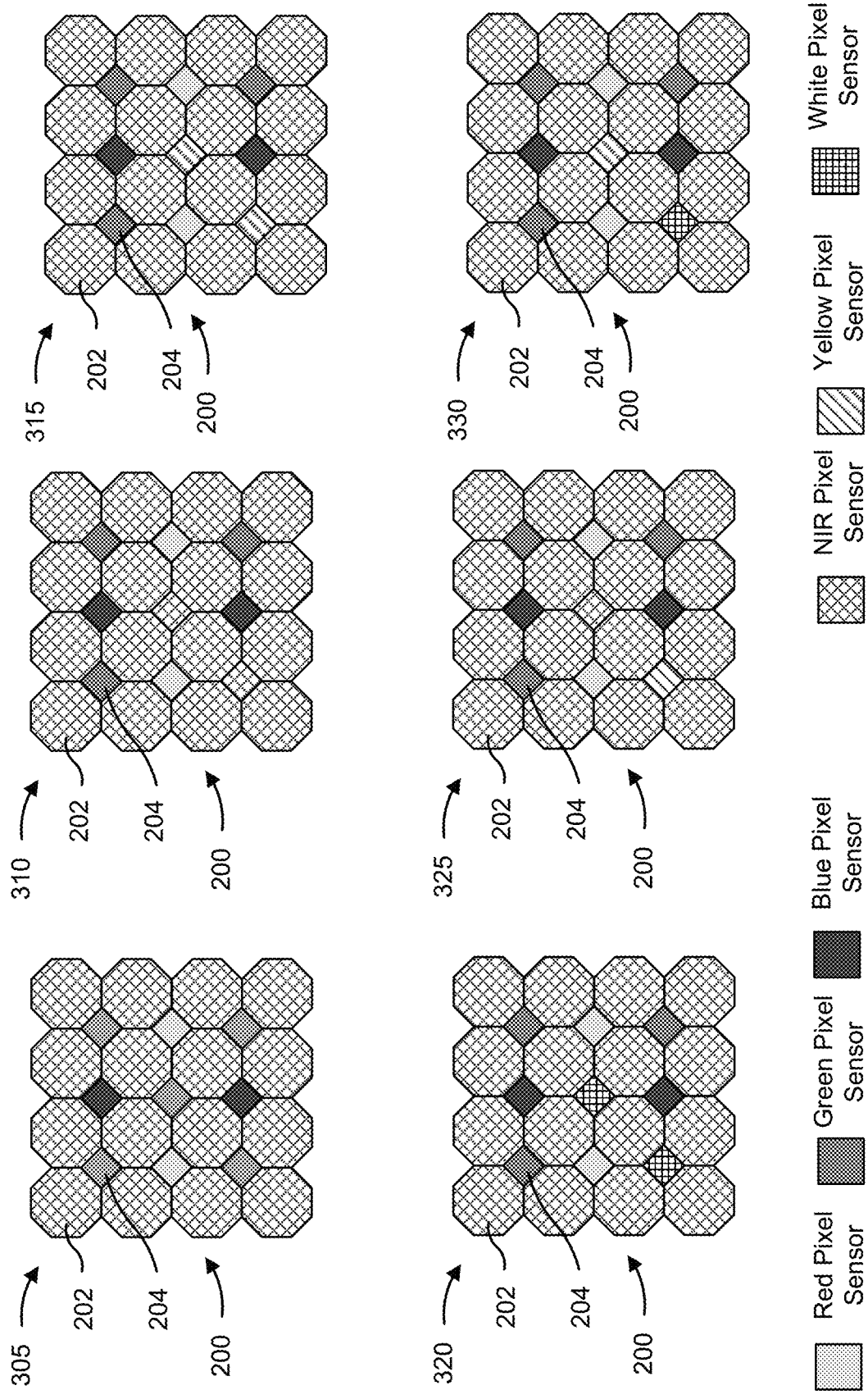
FIGS. 3-30 are diagrams of example pixel configurations for the example pixel array of FIG. 2.

As shown in FIG. 3, an example pixel sensor configuration 305 may include a plurality of octagon-shaped pixel sensors 202 configured as NIR pixel sensors and a plurality of square-shaped pixel sensors 204 configured as red pixel sensors, green pixel sensors, and blue pixel sensors. The octagon-shaped pixel sensors 202 may be configured as NIR pixel sensors to provide high contour sharpness and high low-light performance, and the square-shaped pixel sensor 204 may be configured as red pixel sensors, green pixel sensors, and blue pixel sensors to provide a small amount of color saturation.

As further shown in FIG. 3, an example pixel sensor configuration 310 may include a plurality of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as NIR pixel sensors. The octagon-shaped pixel sensors 202 may be configured as NIR pixel sensors to provide high contour sharpness and high low-light performance. The greater the quantity of square-shaped pixel sensor 204 configured as red pixel sensors, green pixel sensors, and blue pixel sensors, and the lesser the quantity of square-shaped pixel sensors 204 configured as NIR pixel sensors may increase the amount of color saturation while decreasing the contour sharpness and low-light performance increase provided by the square-shaped pixel sensors 204. The lesser the quantity of square-shaped pixel sensor 204 configured as red pixel sensors, green pixel sensors, and blue pixel sensors, and the greater the quantity of square-shaped pixel sensors 204 configured as NIR pixel sensors may decrease the amount of color saturation while increasing the contour sharpness and low-light performance increase provided by the square-shaped pixel sensors 204. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 3, an example pixel sensor configuration 315 may include a plurality of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as yellow pixel sensors. The octagon-shaped pixel sensors 202 may be configured as NIR pixel sensors to provide high contour sharpness and high low-light performance. The greater the quantity of square-shaped pixel sensor 204 configured as red pixel sensors, green pixel sensors, and blue pixel sensors, and the lesser the quantity of square-shaped pixel sensors 204 configured as yellow pixel sensors may increase the amount of color saturation while decreasing the blue light and green light performance increase provided by the square-shaped pixel sensors 204. The lesser the quantity of square-shaped pixel sensor 204 configured as red pixel sensors, green pixel sensors, and blue pixel sensors, and the greater the quantity of square-shaped pixel sensors 204 configured as yellow pixel sensors may decrease the amount of color saturation while increasing the blue light and green light performance increase provided by the square-shaped pixel sensors 204. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 3, an example pixel sensor configuration 320 may include a plurality of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as white pixel sensors. The octagon-shaped pixel sensors 202 may be configured as NIR pixel sensors to provide high contour sharpness and high low-light performance. The greater the quantity of square-shaped pixel sensor 204 configured as red pixel sensors, green pixel sensors, and blue pixel sensors, and the lesser the quantity of square-shaped pixel sensors 204 configured as white pixel sensors may increase the amount of color saturation while decreasing the light sensitivity and brightness increase provided by the square-shaped pixel sensors 204. The lesser the quantity of square-shaped pixel sensor 204 configured as red pixel sensors, green pixel sensors, and blue pixel sensors, and the greater the quantity of square-shaped pixel sensors 204 configured as white pixel sensors may decrease the amount of color saturation while increasing the light sensitivity and brightness increase provided by the square-shaped pixel sensors 204. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 3, an example pixel sensor configuration 325 may include a plurality of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The octagon-shaped pixel sensors 202 may be configured as NIR pixel sensors to provide high contour sharpness and high low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 3, an example pixel sensor configuration 330 may include a plurality of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The octagon-shaped pixel sensors 202 may be configured as NIR pixel sensors to provide high contour sharpness and high low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

Figure 4:
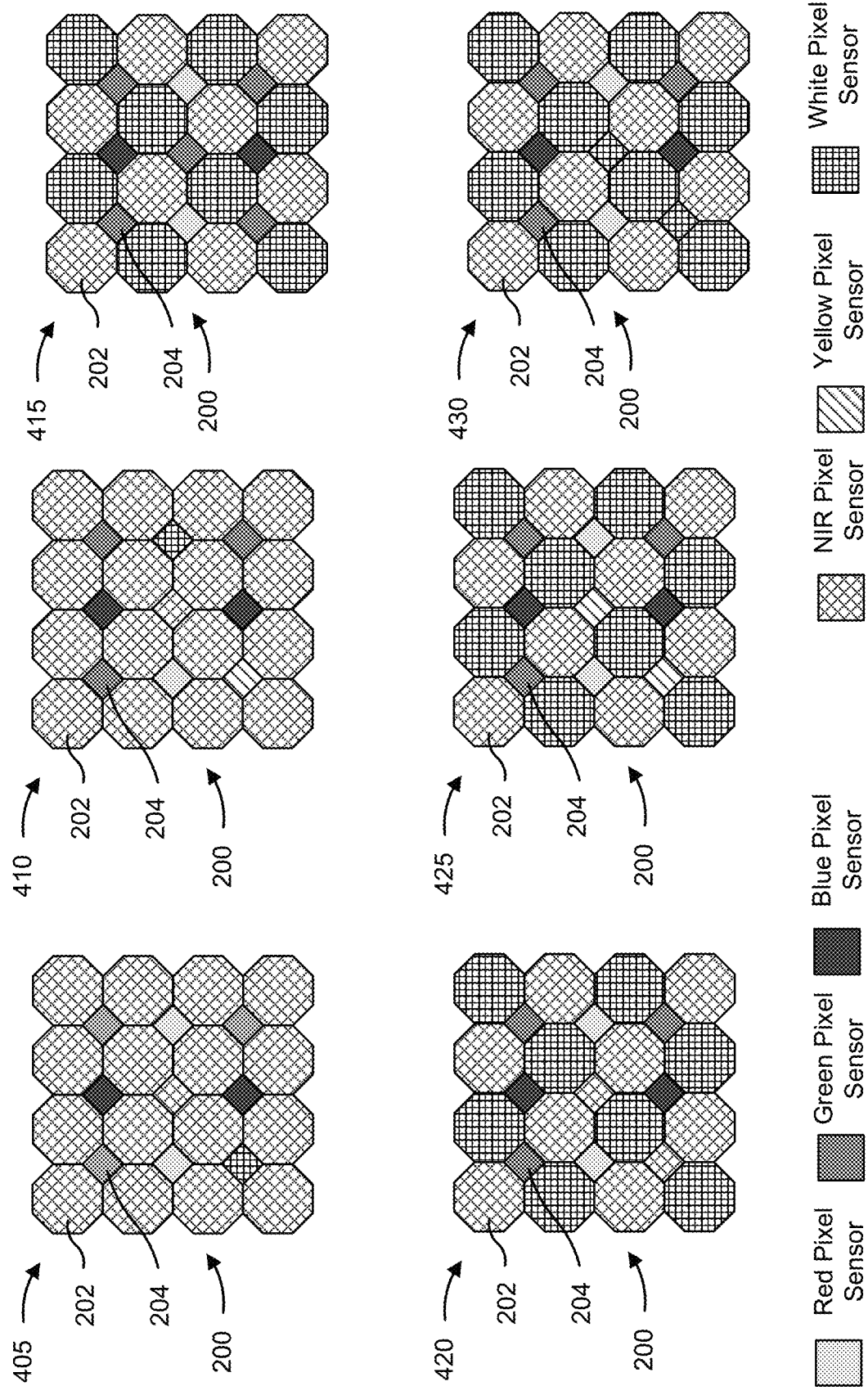

As shown in FIG. 4, an example pixel sensor configuration 405 may include a plurality of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as NIR pixel sensors. The octagon-shaped pixel sensors 202 may be configured as NIR pixel sensors to provide high contour sharpness and high low-light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 4, an example pixel sensor configuration 410 may include a plurality of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The octagon-shaped pixel sensors 202 may be configured as NIR pixel sensors to provide high contour sharpness and high low-light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 4, an example pixel sensor configuration 415 may include a first subset of octagon-shaped pixel sensors 202 configured as NIR pixel sensors, a second subset of octagon-shaped pixel sensors 202 configured as white pixel sensors, and a plurality of square-shaped pixel sensors 204 configured as red pixel sensors, green pixel sensors, and blue pixel sensors. The square-shaped pixel sensors 204 may be configured as red pixel sensors, green pixel sensors, and blue pixel sensors to provide moderate to high color performance. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202.

As further shown in FIG. 4, an example pixel sensor configuration 420 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 4, an example pixel sensor configuration 425 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 4, an example pixel sensor configuration 430 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

Figure 5:
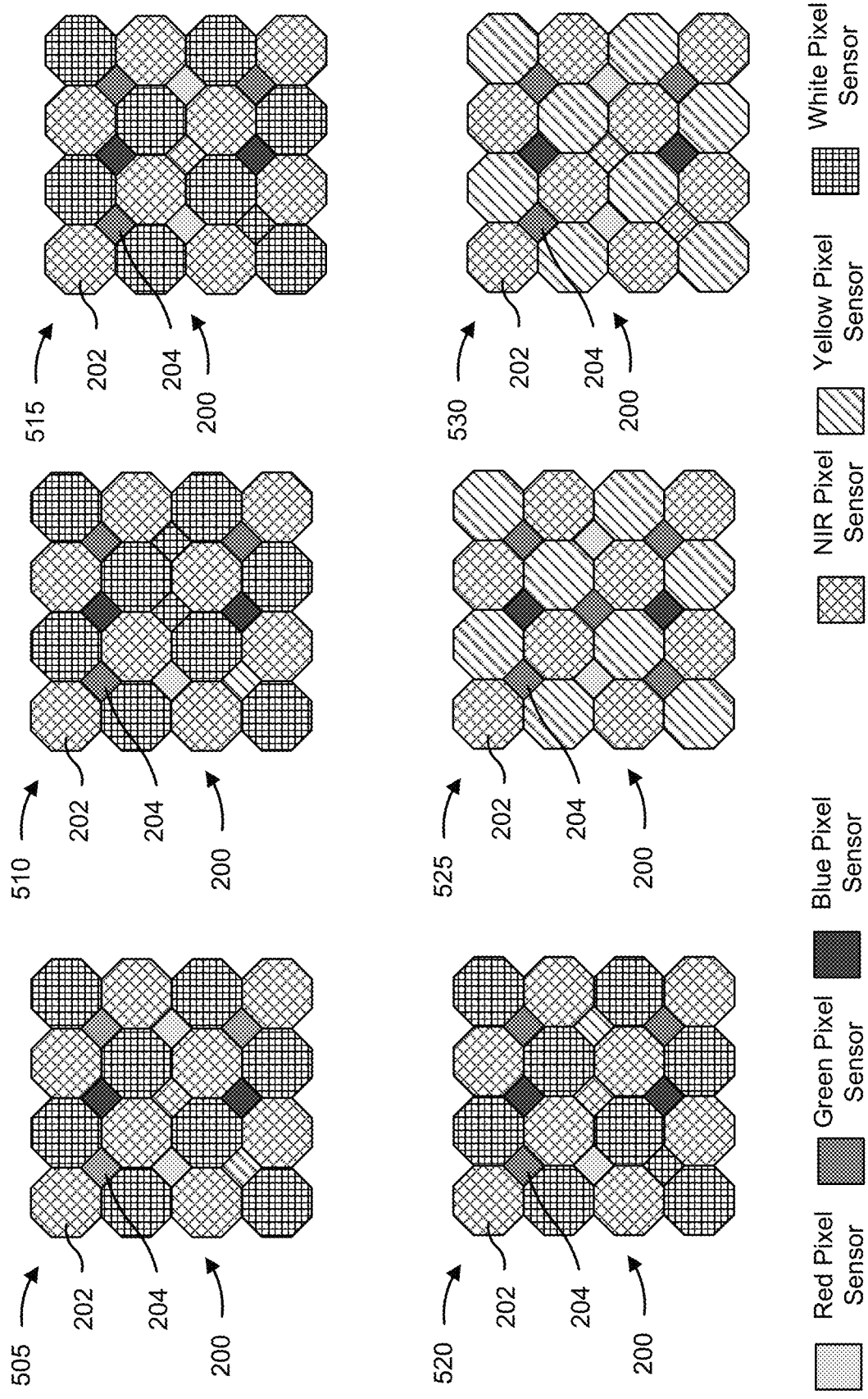

As shown in FIG. 5, an example pixel sensor configuration 505 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as yellow pixel sensors, and a third subset of square-shaped pixel sensors 204 configured as NIR pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As shown in FIG. 5, an example pixel sensor configuration 510 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As shown in FIG. 5, an example pixel sensor configuration 515 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as NIR pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 5, an example pixel sensor configuration 520 may include a first subset of octagon-shaped pixel sensors 202 configured as NIR pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, a third subset of square-shaped pixel sensors 204 configured as NIR pixel sensors, and a fourth subset of square-shaped pixel sensors 204 configured as yellow pixel sensors. The greater the quantity of octagon-shaped pixel sensor 202 configured as NIR pixel sensors, and the lesser the quantity of octagon-shaped pixel sensor 202 configured as white pixel sensors may increase the amount of contour sharpness and low-light performance while decreasing the light sensitivity and brightness increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 5, an example pixel sensor configuration 525 may include a first subset of octagon-shaped pixel sensors 202 configured as NIR pixel sensors, a second subset of octagon-shaped pixel sensors 202 configured as yellow pixel sensors, and a plurality of square-shaped pixel sensors 204 configured as red pixel sensors, green pixel sensors, and blue pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. The square-shaped pixel sensors 204 may be configured as red pixel sensors, green pixel sensors, and blue pixel sensors to provide moderate to high color performance.

As further shown in FIG. 5, an example pixel sensor configuration 530 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as NIR pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

Figure 6:
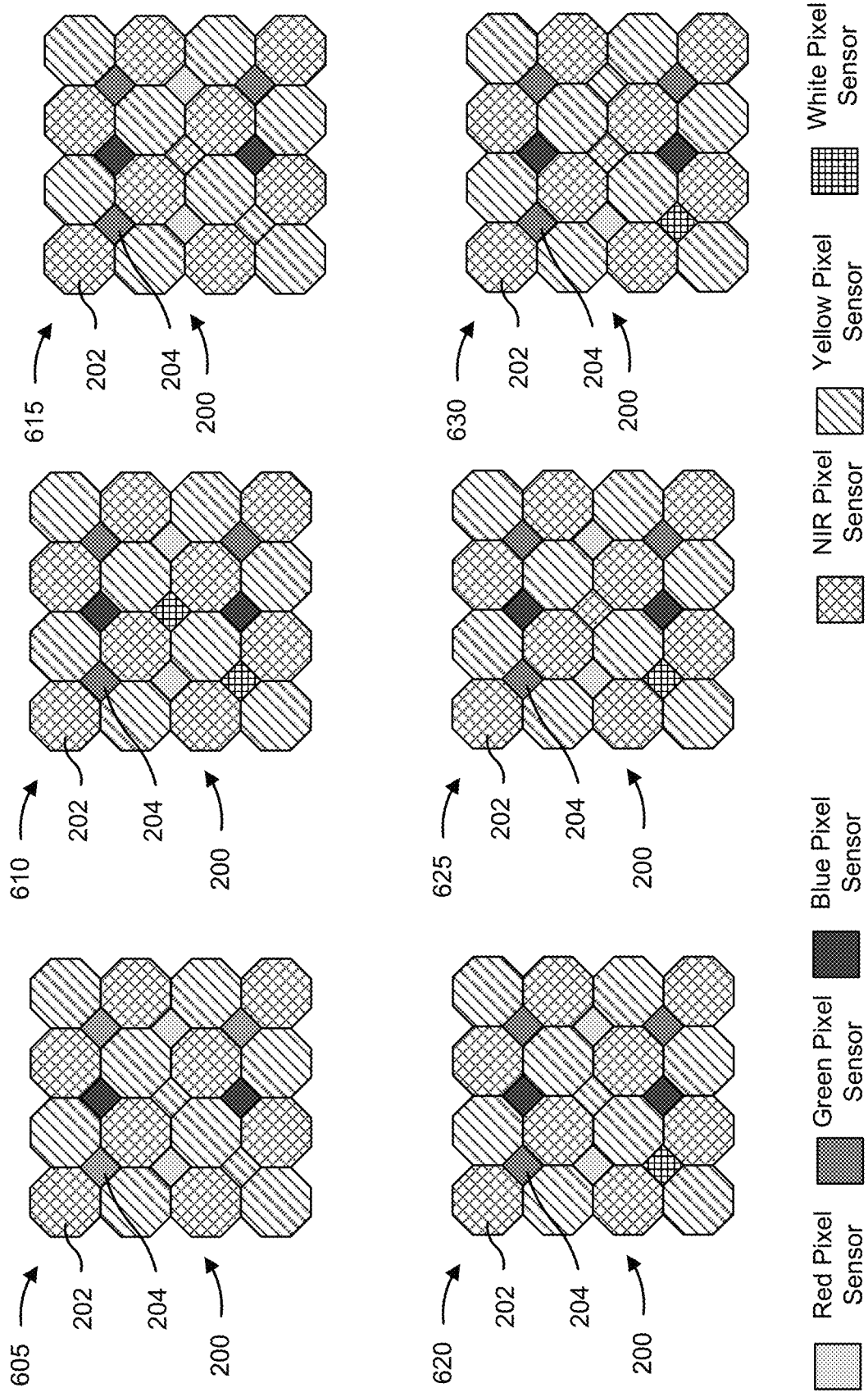

As shown in FIG. 6, an example pixel sensor configuration 605 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as yellow pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 6, an example pixel sensor configuration 610 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as white pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 6, an example pixel sensor configuration 615 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 6, an example pixel sensor configuration 620 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as yellow pixel sensors, and a third subset of square-shaped pixel sensors 204 configured as white pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 6, an example pixel sensor configuration 625 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as NIR pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 6, an example pixel sensor configuration 630 may include a first subset of octagon-shaped pixel sensors 202 configured as NIR pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The greater the quantity of octagon-shaped pixel sensor 202 configured as NIR pixel sensors, and the lesser the quantity of octagon-shaped pixel sensor 202 configured as yellow pixel sensors may increase the amount of contour sharpness and low-light performance while decreasing the blue light and green light performance increase provided by the octagon-shaped pixel sensor 202. The lesser the quantity of octagon-shaped pixel sensor 202 configured as NIR pixel sensors, and the greater the quantity of octagon-shaped pixel sensor 202 configured as white pixel sensors may decrease the amount of contour sharpness and low-light performance while increasing the blue light and green light performance increase provided by the octagon-shaped pixel sensor 202. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

Figure 7:
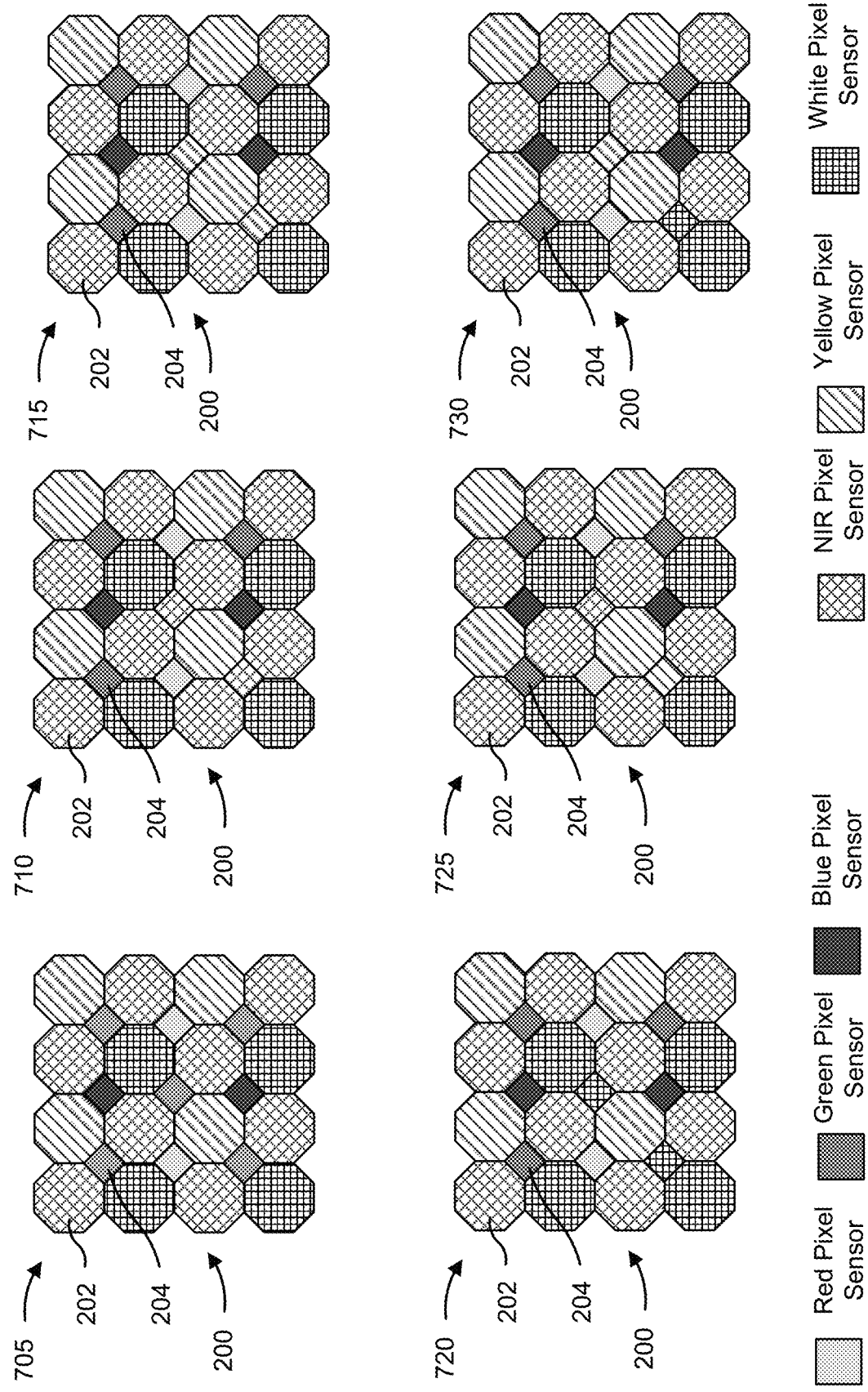

As shown in FIG. 7, an example pixel sensor configuration 705 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, and a plurality of square-shaped pixel sensors 204 configured as red pixel sensors, green pixel sensors, and blue pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. The square-shaped pixel sensors 204 may be configured as red pixel sensors, green pixel sensors, and blue pixel sensors to provide moderate to high color performance.

As further shown in FIG. 7, an example pixel sensor configuration 710 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 7, an example pixel sensor configuration 715 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 7, an example pixel sensor configuration 720 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 7, an example pixel sensor configuration 725 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 7, an example pixel sensor configuration 730 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

Figure 8:
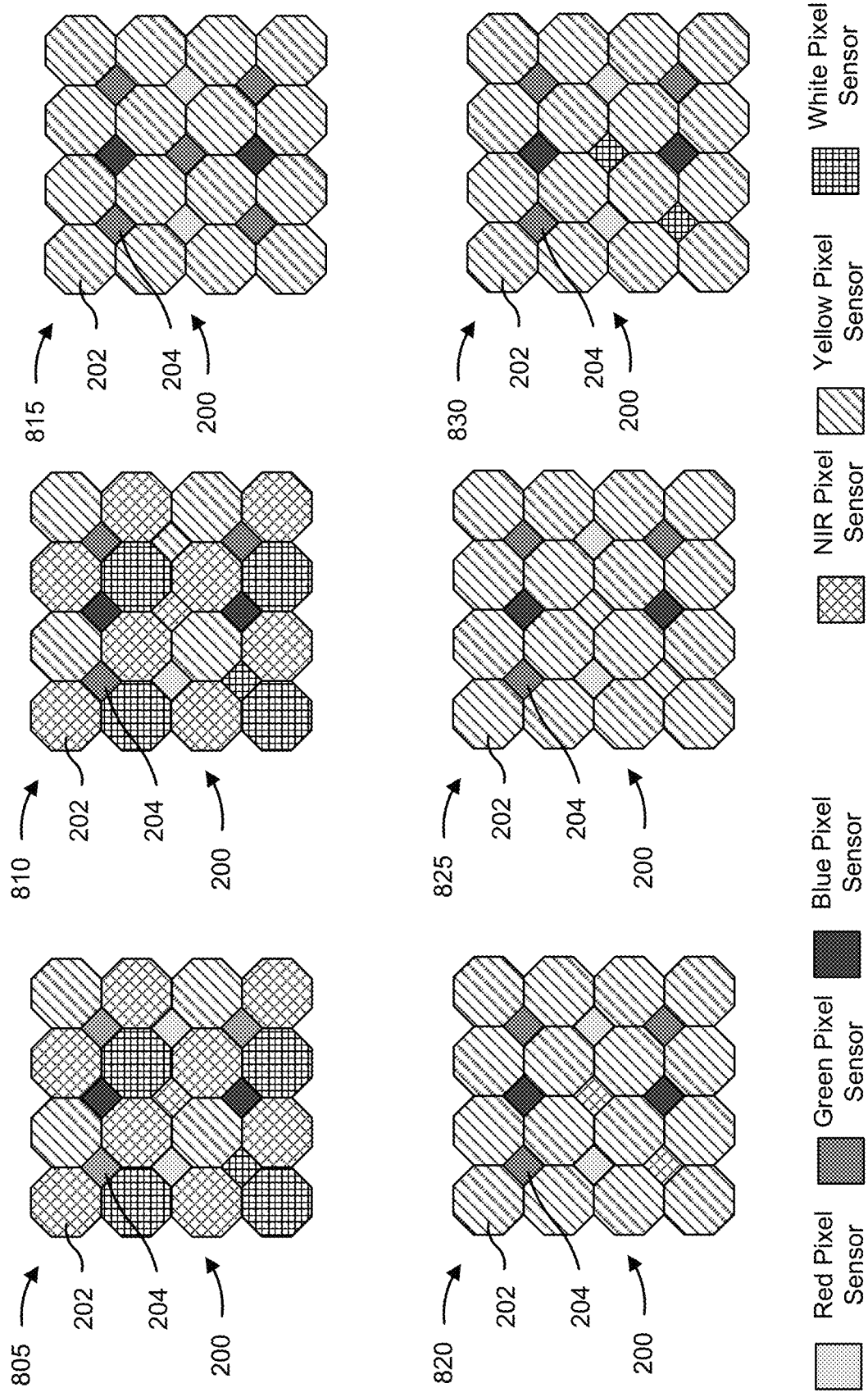

As shown in FIG. 8, an example pixel sensor configuration 805 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as NIR pixel sensors. The quantity of octagon-shaped pixel sensor 202 configured as NIR pixel sensors may be increased or decreased to increase or decrease the amount of contour sharpness and low-light performance provided by the octagon-shaped pixel sensor 202. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 8, an example pixel sensor configuration 810 may include a first subset of octagon-shaped pixel sensors 202 configured as NIR pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, a third subset of square-shaped pixel sensors 204 configured as yellow pixel sensors, and a fourth subset of square-shaped pixel sensors 204 configured as NIR pixel sensors. The square-shaped pixel sensors 204 may be configured as red pixel sensors, green pixel sensors, and blue pixel sensors to provide a small amount of color saturation increase, and the octagon-shaped pixel sensor 202 may be configured as yellow pixel sensors to provide a high amount of blue light performance increase and/or a small amount of green light performance increase. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 8, an example pixel sensor configuration 815 may include a plurality of octagon-shaped pixel sensors 202 configured as yellow pixel sensors, and a plurality of square-shaped pixel sensors 204 configured as red pixel sensors, green pixel sensors, and blue pixel sensors. The octagon-shaped pixel sensors 202 may be configured as yellow pixel sensors to provide high blue light and green light performance. The square-shaped pixel sensors 204 may be configured as red pixel sensors, green pixel sensors, and blue pixel sensors to provide moderate to high color performance.

As further shown in FIG. 8, an example pixel sensor configuration 820 may include a plurality of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as NIR pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 8, an example pixel sensor configuration 825 may include a plurality of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as yellow pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 8, an example pixel sensor configuration 830 may include a plurality of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as white pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

Figure 9:
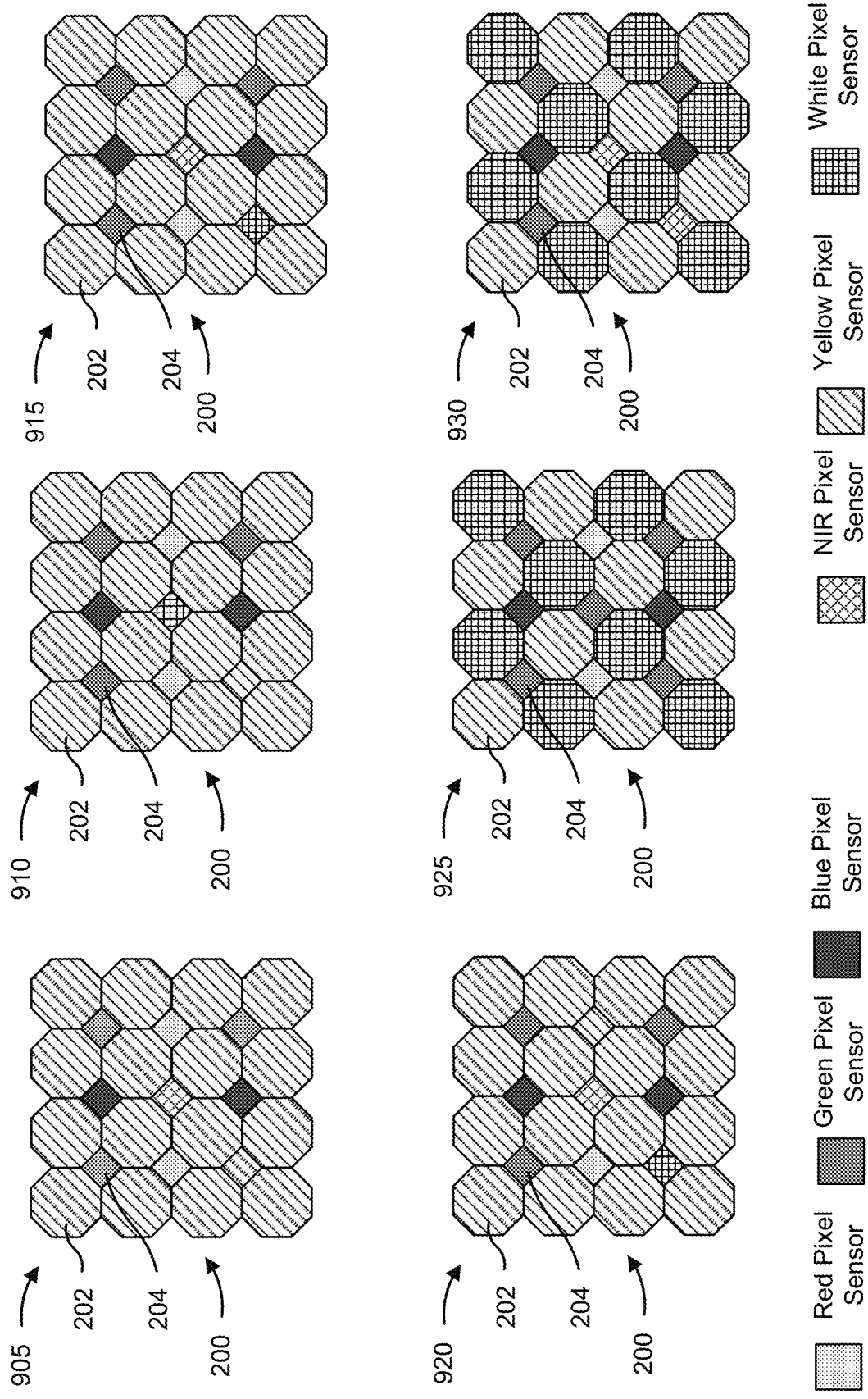

As shown in FIG. 9, an example pixel sensor configuration 905 may include a plurality of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 9, an example pixel sensor configuration 910 may include a plurality of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 9, an example pixel sensor configuration 915 may include a plurality of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 9, an example pixel sensor configuration 920 may include a plurality of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The octagon-shaped pixel sensors 202 may be configured as yellow pixel sensors to provide high blue light and green light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 9, an example pixel sensor configuration 925 may include a first subset of octagon-shaped pixel sensors 202 configured as yellow pixel sensors, a second subset of octagon-shaped pixel sensors 202 configured as white pixel sensors, and a plurality of square-shaped pixel sensors 204 configured as red pixel sensors, green pixel sensors, and blue pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. The square-shaped pixel sensors 204 may be configured as red pixel sensors, green pixel sensors, and blue pixel sensors to provide moderate to high color performance.

As further shown in FIG. 9, an example pixel sensor configuration 930 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

Figure 10:
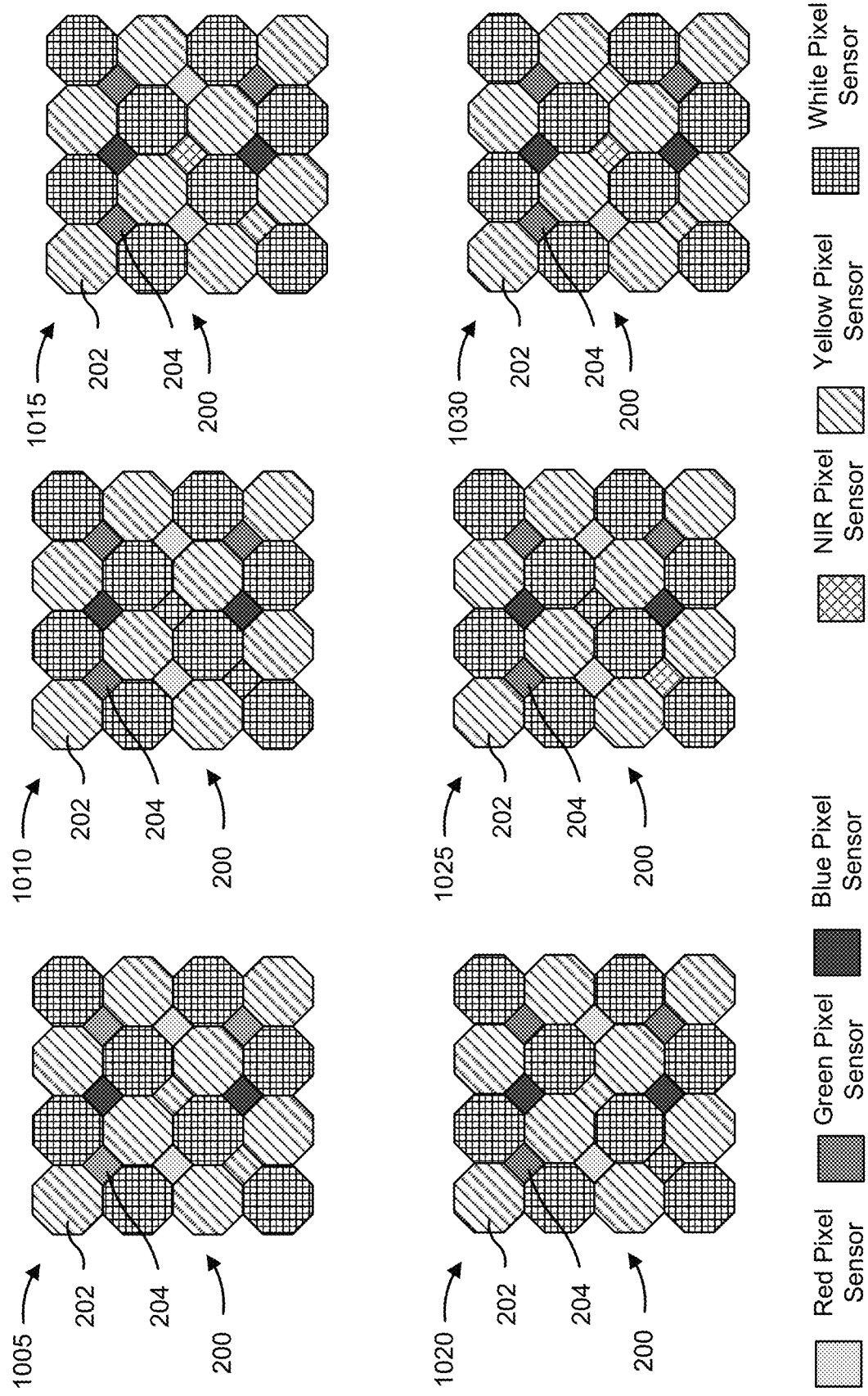

As shown in FIG. 10, an example pixel sensor configuration 1005 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 10, an example pixel sensor configuration 1010 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 10, an example pixel sensor configuration 1015 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 10, an example pixel sensor configuration 1020 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 10, an example pixel sensor configuration 1025 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 10, an example pixel sensor configuration 1030 may include a first subset of octagon-shaped pixel sensors 202 configured as yellow pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The quantity of octagon-shaped pixel sensor 202 configured as yellow pixel sensors may be increased or decreased to increase or decrease the amount the blue light and green light performance increase provided by the octagon-shaped pixel sensor 202. The quantity of octagon-shaped pixel sensor 202 configured as white pixel sensors may be increased or decreased to increase or decrease the amount the light sensitivity and brightness increase provided by the octagon-shaped pixel sensor 202. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

Figure 11:
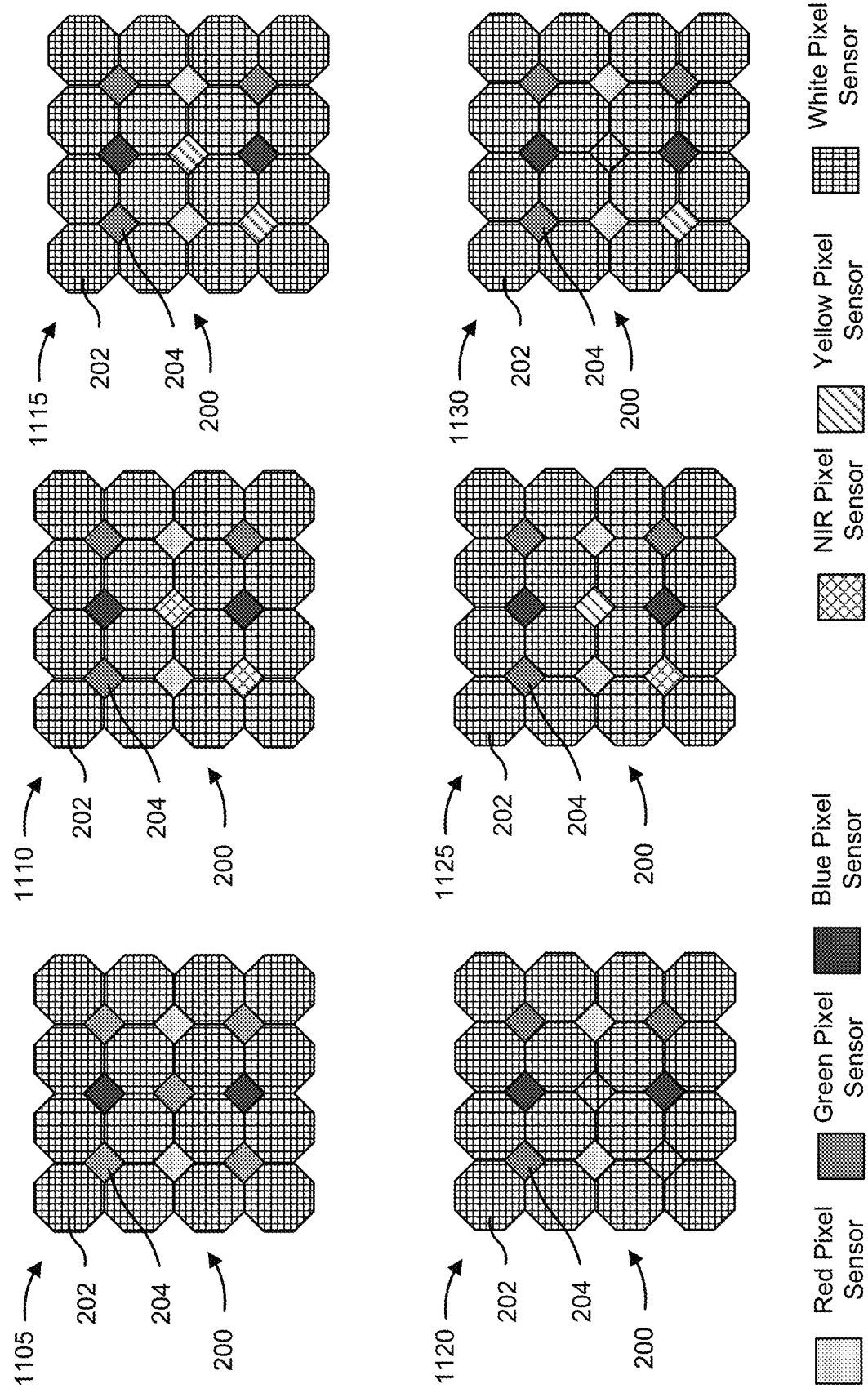

As shown in FIG. 11, an example pixel sensor configuration 1105 may include a plurality of octagon-shaped pixel sensors 202 configured as white pixel sensors, and a plurality of square-shaped pixel sensors 204 configured as red pixel sensors, green pixel sensors, and blue pixel sensors. The octagon-shaped pixel sensors 202 may be configured as white pixel sensors to provide a high light sensitivity and brightness performance. The square-shaped pixel sensors 204 may be configured as red pixel sensors, green pixel sensors, and blue pixel sensors to provide moderate to high color performance.

As further shown in FIG. 11, an example pixel sensor configuration 1110 may include a plurality of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 11, an example pixel sensor configuration 1115 may include a plurality of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as yellow pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 11, an example pixel sensor configuration 1120 may include a plurality of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 11, an example pixel sensor configuration 1125 may include a plurality of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 11, an example pixel sensor configuration 1130 may include a plurality of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

Figure 12:
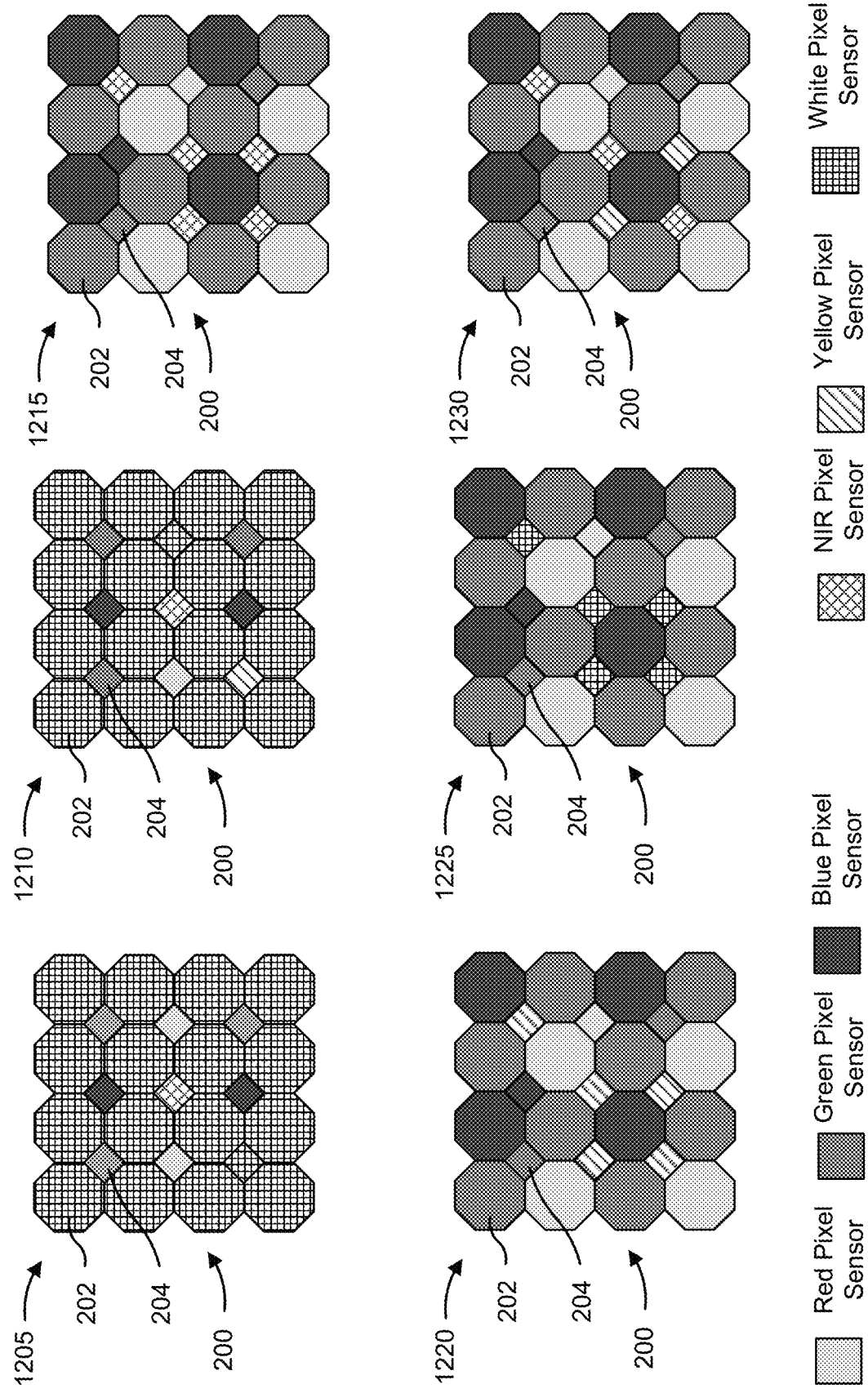

As shown in FIG. 12, an example pixel sensor configuration 1205 may include a plurality of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 12, an example pixel sensor configuration 1210 may include a plurality of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The octagon-shaped pixel sensors 202 may be configured as white pixel sensors to provide a high light sensitivity and brightness performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 12, an example pixel sensor configuration 1215 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, and a second subset of square-shaped pixel sensors 204 configured as NIR pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 12, an example pixel sensor configuration 1220 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, and a second subset of square-shaped pixel sensors 204 configured as yellow pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 12, an example pixel sensor configuration 1225 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, and a second subset of square-shaped pixel sensors 204 configured as white pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 12, an example pixel sensor configuration 1230 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

Figure 13:
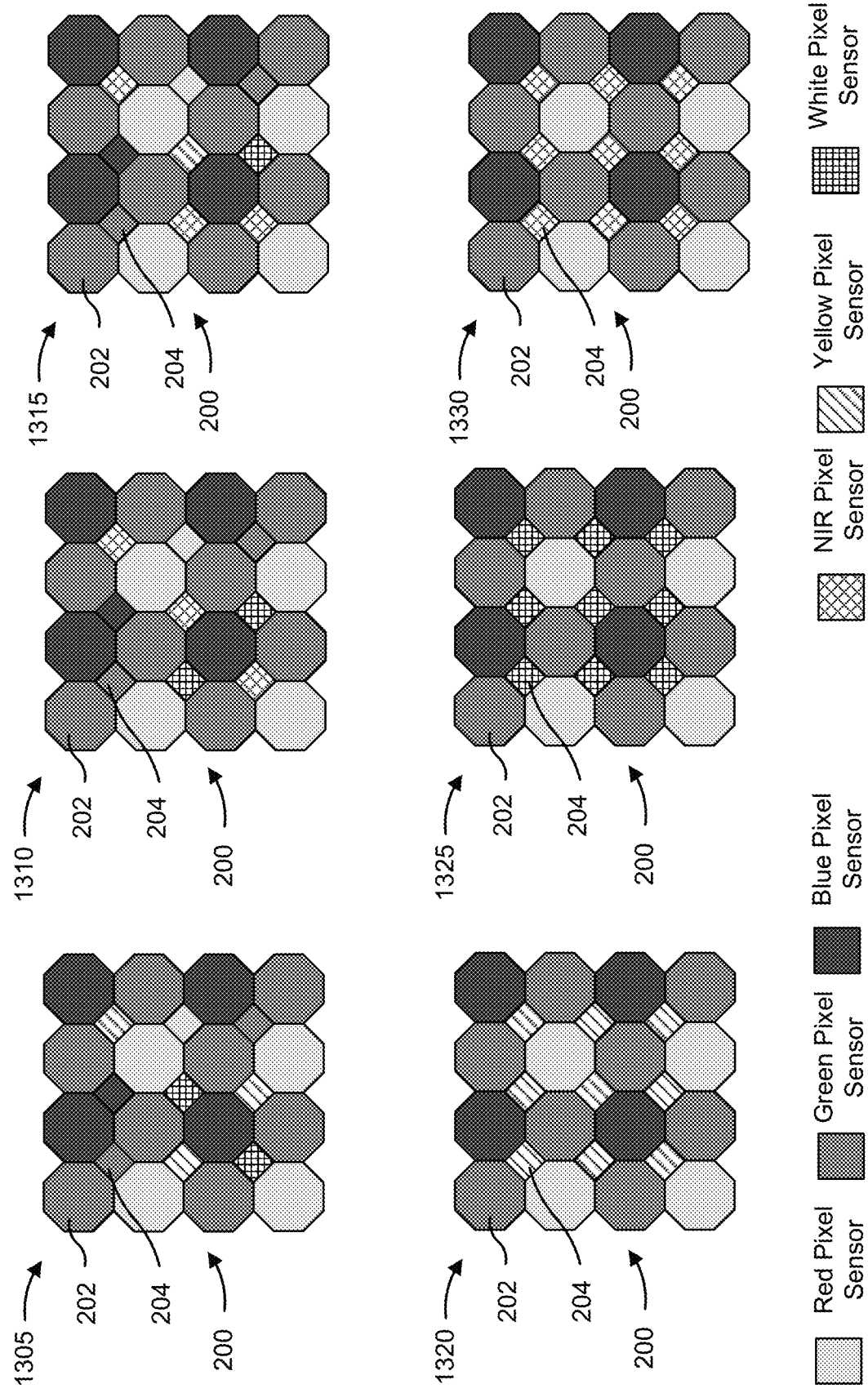

As shown in FIG. 13, an example pixel sensor configuration 1305 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 13, an example pixel sensor configuration 1310 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 13, an example pixel sensor configuration 1315 may include a plurality of octagon-shaped pixel sensors 202 configured as red pixel sensors, green pixel sensors, and blue pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. The octagon-shaped pixel sensors 202 may be configured as red pixel sensors, green pixel sensors, and blue pixel sensors to provide high color saturation. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 13, an example pixel sensor configuration 1320 may include a plurality of octagon-shaped pixel sensors 202 configured as red pixel sensors, green pixel sensors, and blue pixel sensors, and a plurality of square-shaped pixel sensors 204 configured as yellow pixel sensors. The octagon-shaped pixel sensors 202 may be configured as red pixel sensors, green pixel sensors, and blue pixel sensors to provide a high amount of color saturation increase, and the square-shaped pixel sensor 204 may be configured as yellow pixel sensors to provide a small amount of blue light performance increase and/or a small amount of green light performance increase. The square-shaped pixel sensors 204 may be configured as yellow pixel sensors to provide moderate to high blue light and green light performance increase.

As further shown in FIG. 13, an example pixel sensor configuration 1325 may include a plurality of octagon-shaped pixel sensors 202 configured as red pixel sensors, green pixel sensors, and blue pixel sensors, and a plurality of square-shaped pixel sensors 204 configured as white pixel sensors. The octagon-shaped pixel sensors 202 may be configured as red pixel sensors, green pixel sensors, and blue pixel sensors to provide high color saturation. The square-shaped pixel sensors 204 may be configured as white pixel sensors to provide moderate to high light sensitivity and brightness performance increase.

As further shown in FIG. 13, an example pixel sensor configuration 1330 may include a plurality of octagon-shaped pixel sensors 202 configured as red pixel sensors, green pixel sensors, and blue pixel sensors, and a plurality of square-shaped pixel sensors 204 configured as NIR pixel sensors. The square-shaped pixel sensors 204 may be configured as NIR pixel sensors to provide a small to moderate amount of contour sharpness increase and a small to moderate amount of low-light performance increase, and the octagon-shaped pixel sensor 202 may be configured as red pixel sensors, green pixel sensors, and blue pixel sensors to provide a high amount of color saturation increase.

Figure 14:
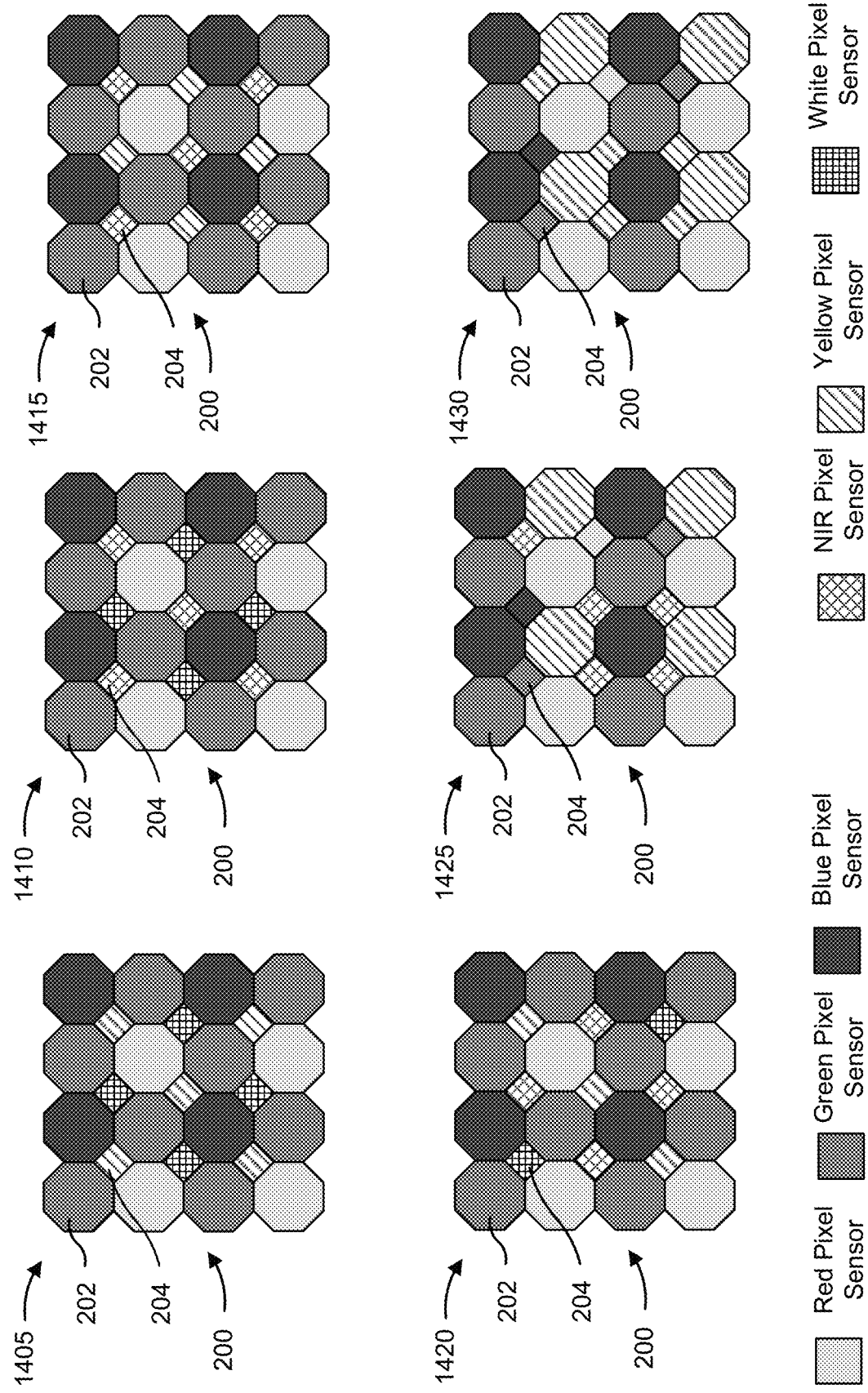

As shown in FIG. 14, an example pixel sensor configuration 1405 may include a plurality of octagon-shaped pixel sensors 202 configured as red pixel sensors, green pixel sensors, and blue pixel sensors, a first subset of square-shaped pixel sensors 204 configured as white pixel sensors, and a second subset of square-shaped pixel sensors 204 configured as yellow pixel sensors. The octagon-shaped pixel sensors 202 may be configured as red pixel sensors, green pixel sensors, and blue pixel sensors to provide high color saturation. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 14, an example pixel sensor configuration 1410 may include a plurality of octagon-shaped pixel sensors 202 configured as red pixel sensors, green pixel sensors, and blue pixel sensors, a first subset of square-shaped pixel sensors 204 configured as white pixel sensors, and a second subset of square-shaped pixel sensors 204 configured as NIR pixel sensors. The octagon-shaped pixel sensors 202 may be configured as red pixel sensors, green pixel sensors, and blue pixel sensors to provide high color saturation. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 14, an example pixel sensor configuration 1415 may include a plurality of octagon-shaped pixel sensors 202 configured as red pixel sensors, green pixel sensors, and blue pixel sensors, a first subset of square-shaped pixel sensors 204 configured as NIR pixel sensors, and a second subset of square-shaped pixel sensors 204 configured as yellow pixel sensors. The octagon-shaped pixel sensors 202 may be configured as red pixel sensors, green pixel sensors, and blue pixel sensors to provide high color saturation. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 14, an example pixel sensor configuration 1420 may include a plurality of octagon-shaped pixel sensors 202 configured as red pixel sensors, green pixel sensors, and blue pixel sensors, a first subset of square-shaped pixel sensors 204 configured as white pixel sensors, a second subset of square-shaped pixel sensors 204 configured as yellow pixel sensors, and a third subset of square-shaped pixel sensors 204 configured as NIR pixel sensors. The octagon-shaped pixel sensors 202 may be configured as red pixel sensors, green pixel sensors, and blue pixel sensors to provide high color saturation. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 14, an example pixel sensor configuration 1425 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 14, an example pixel sensor configuration 1430 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

Figure 15:
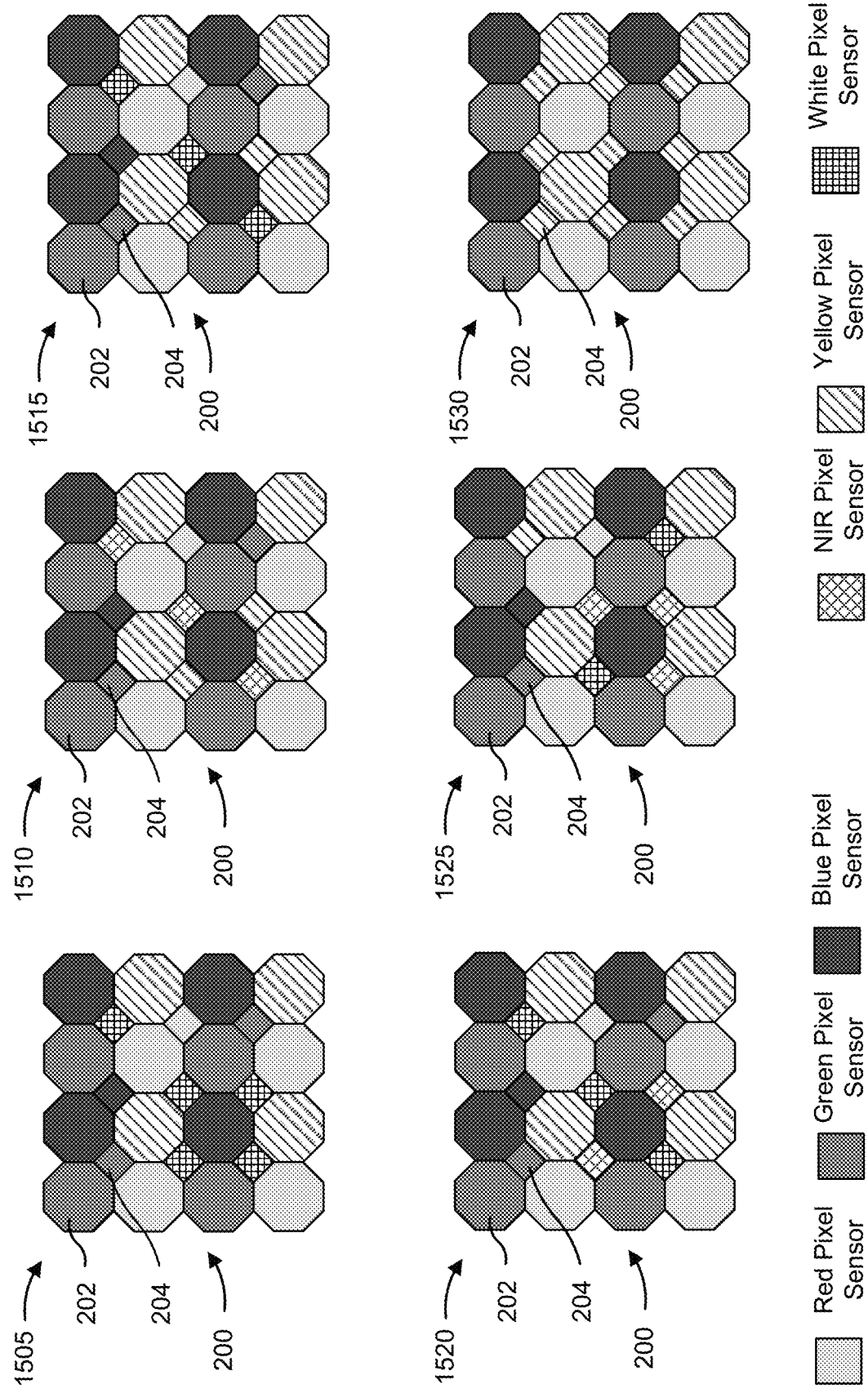

As shown in FIG. 15, an example pixel sensor configuration 1505 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 15, an example pixel sensor configuration 1510 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 15, an example pixel sensor configuration 1515 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 15, an example pixel sensor configuration 1520 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 15, an example pixel sensor configuration 1525 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 15, an example pixel sensor configuration 1530 may include a first subset of octagon-shaped pixel sensors 202 configured as red pixel sensors, green pixel sensors, and blue pixel sensors, a second subset of octagon-shaped pixel sensors 202 configured as yellow pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as yellow pixel sensors to provide moderate to high blue light and green light performance increase.

Figure 16:
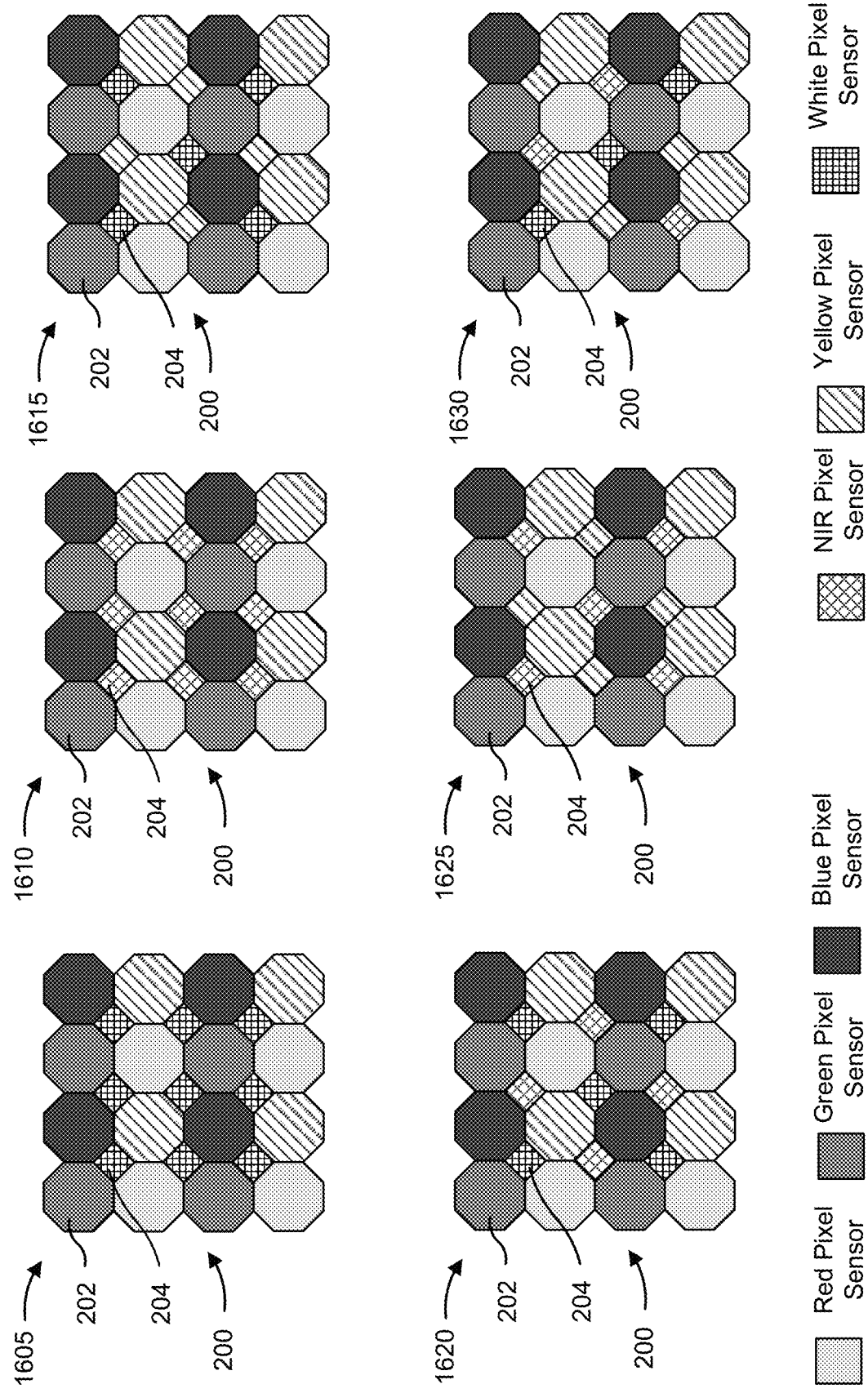

As shown in FIG. 16, an example pixel sensor configuration 1605 may include a first subset of octagon-shaped pixel sensors 202 configured as red pixel sensors, green pixel sensors, and blue pixel sensors, a second subset of octagon-shaped pixel sensors 202 configured as yellow pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as white pixel sensors to provide moderate to high light sensitivity and brightness performance increase.

As further shown in FIG. 16, an example pixel sensor configuration 1610 may include a first subset of octagon-shaped pixel sensors 202 configured as red pixel sensors, green pixel sensors, and blue pixel sensors, a second subset of octagon-shaped pixel sensors 202 configured as yellow pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as NIR pixel sensors to provide moderate to high contour sharpness and low-light performance increase.

As further shown in FIG. 16, an example pixel sensor configuration 1615 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 16, an example pixel sensor configuration 1620 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 16, an example pixel sensor configuration 1625 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 16, an example pixel sensor configuration 1630 may include a first subset of octagon-shaped pixel sensors 202 configured as red pixel sensors, green pixel sensors, and blue pixel sensors, a second subset of octagon-shaped pixel sensors 202 configured as yellow pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

Figure 17:
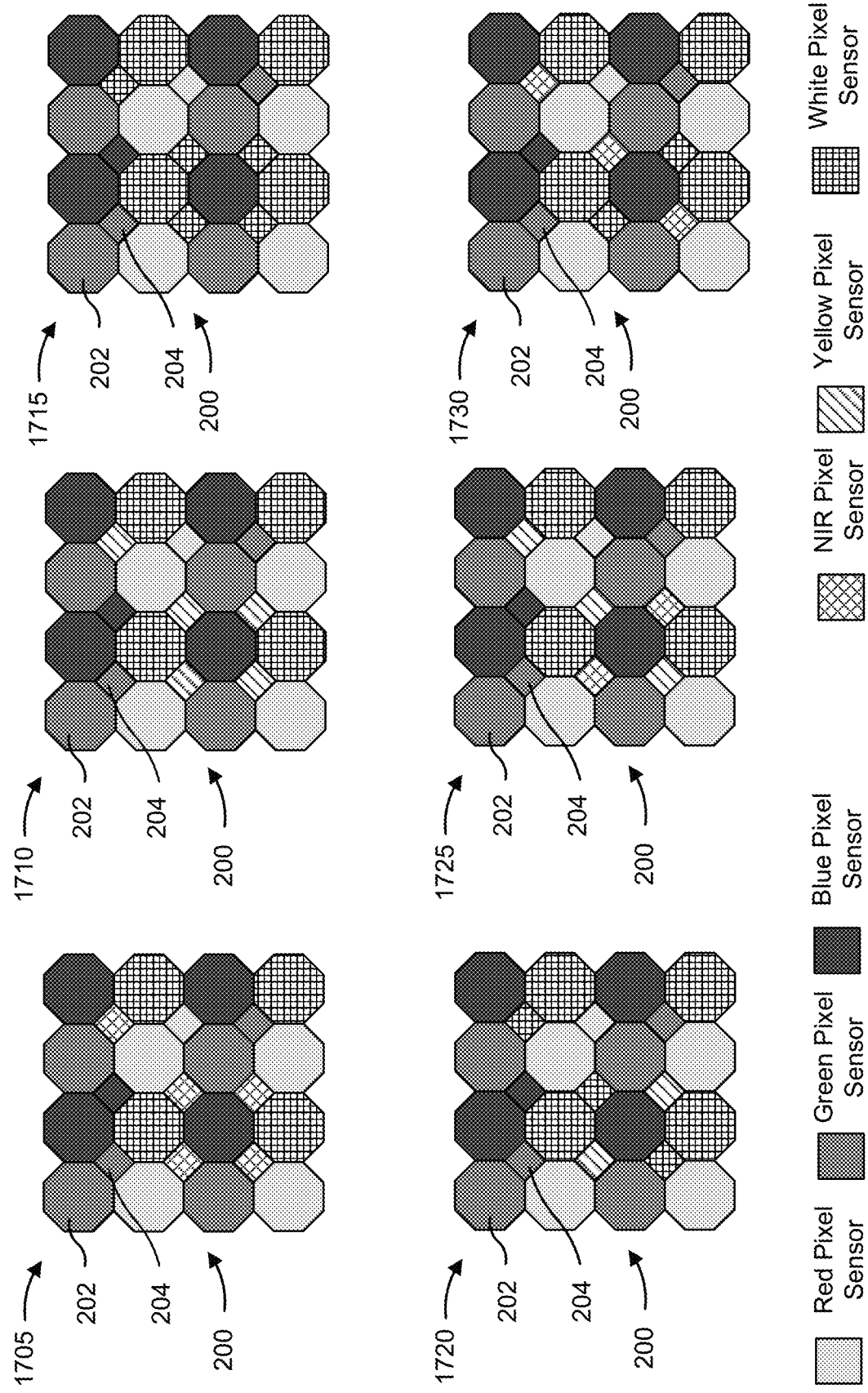

As shown in FIG. 17, an example pixel sensor configuration 1705 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 17, an example pixel sensor configuration 1710 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 17, an example pixel sensor configuration 1715 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 17, an example pixel sensor configuration 1720 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as yellow pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 17, an example pixel sensor configuration 1725 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as yellow pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 17, an example pixel sensor configuration 1730 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

Figure 18:
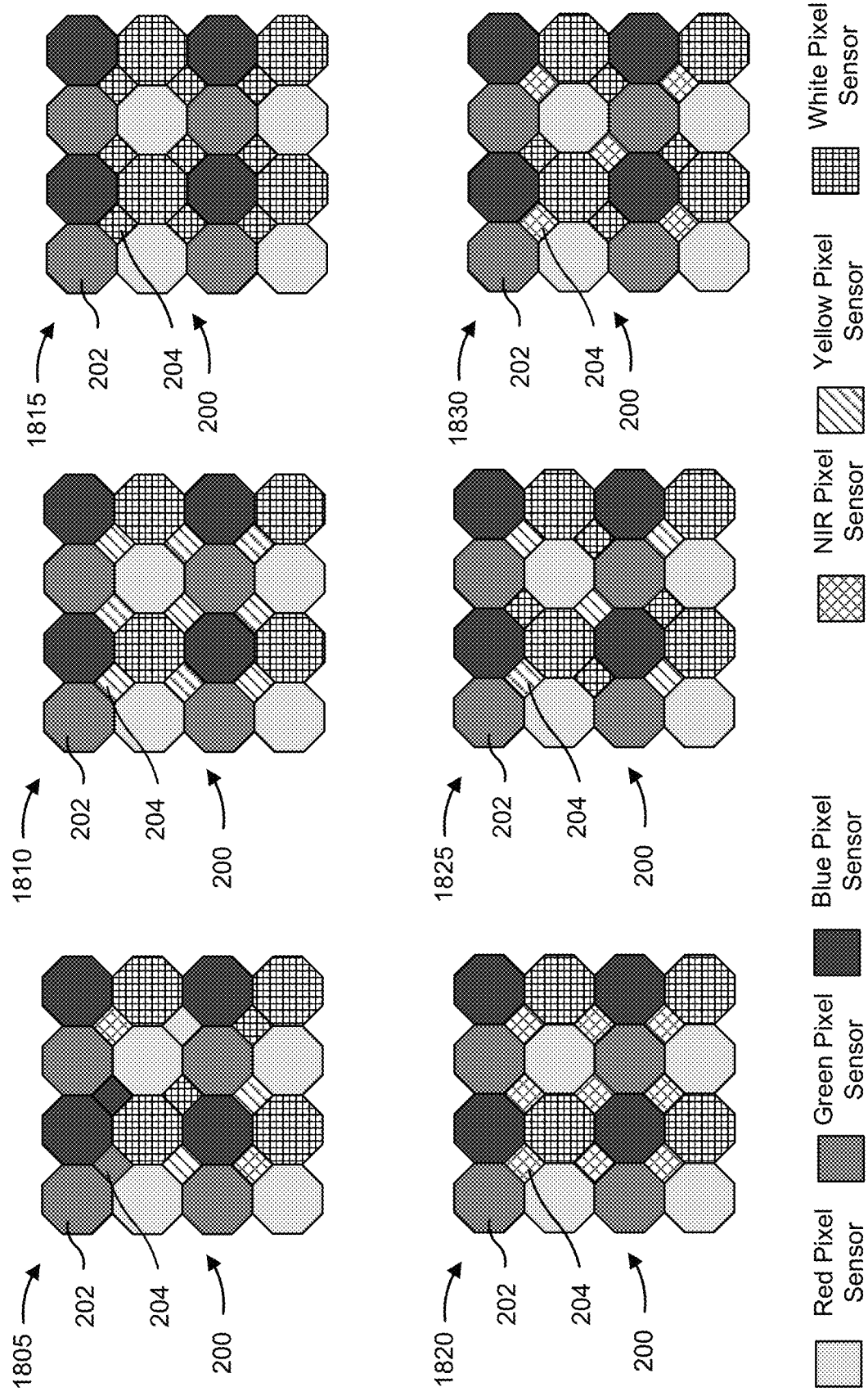

As shown in FIG. 18, an example pixel sensor configuration 1805 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as yellow pixel sensors, a third subset of square-shaped pixel sensors 204 configured as white pixel sensors, and a fourth subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 18, an example pixel sensor configuration 1810 may include a first subset of octagon-shaped pixel sensors 202 configured as red pixel sensors, green pixel sensors, and blue pixel sensors, a second subset of octagon-shaped pixel sensors 202 configured as white pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The square-shaped pixel sensors 204 may be configured as yellow pixel sensors to provide moderate to high blue light and green light performance increase.

As further shown in FIG. 18, an example pixel sensor configuration 1815 may include a first subset of octagon-shaped pixel sensors 202 configured as red pixel sensors, green pixel sensors, and blue pixel sensors, a second subset of octagon-shaped pixel sensors 202 configured as white pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The square-shaped pixel sensors 204 may be configured as white pixel sensors to provide moderate to high light sensitivity and brightness performance increase.

As further shown in FIG. 18, an example pixel sensor configuration 1820 may include a first subset of octagon-shaped pixel sensors 202 configured as red pixel sensors, green pixel sensors, and blue pixel sensors, a second subset of octagon-shaped pixel sensors 202 configured as white pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The square-shaped pixel sensors 204 may be configured as NIR pixel sensors to provide moderate to high contour sharpness and low-light performance increase.

As further shown in FIG. 18, an example pixel sensor configuration 1825 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 18, an example pixel sensor configuration 1830 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

Figure 19:
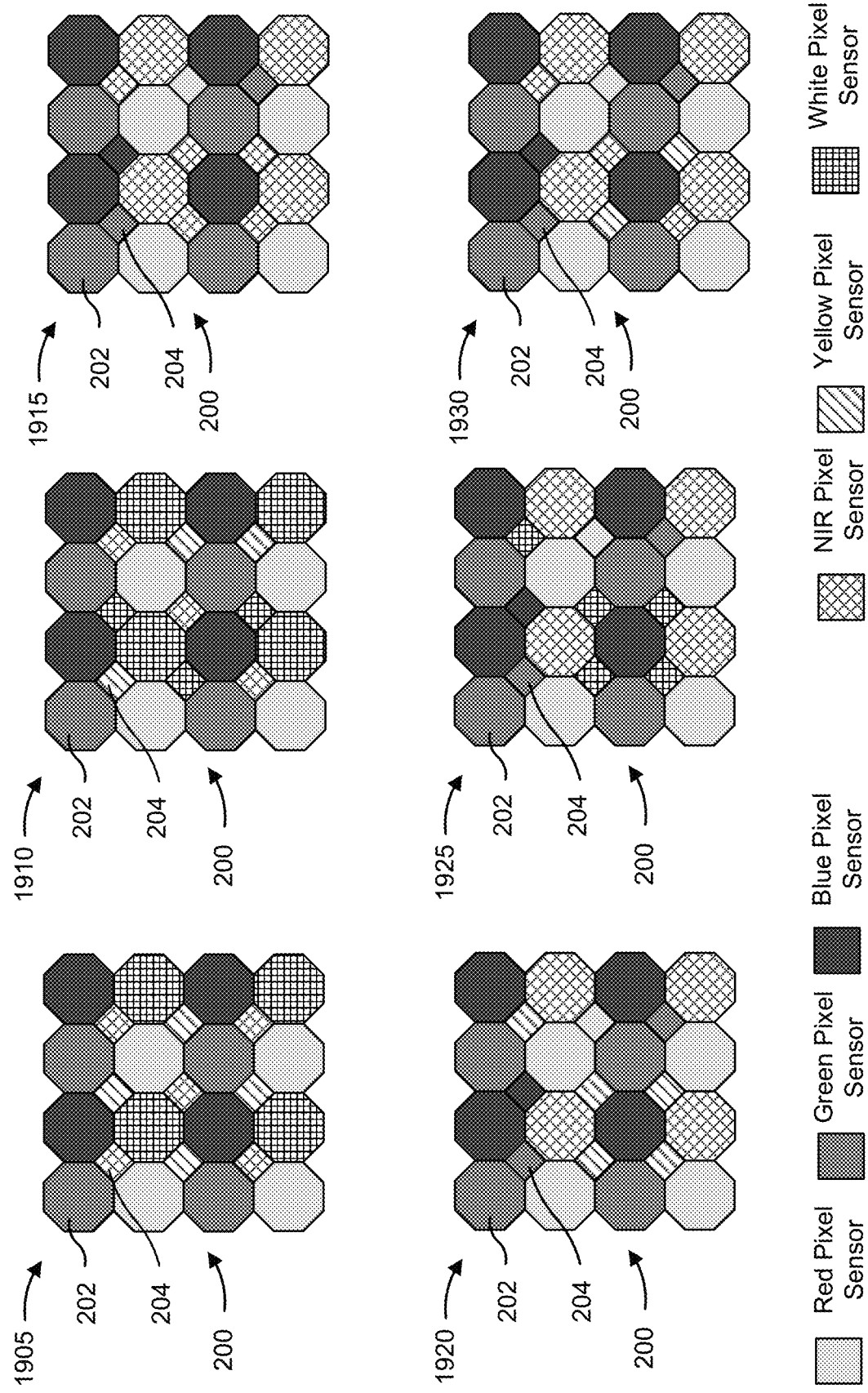

As shown in FIG. 19, an example pixel sensor configuration 1905 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 19, an example pixel sensor configuration 1910 may include a first subset of octagon-shaped pixel sensors 202 configured as red pixel sensors, green pixel sensors, and blue pixel sensors, a second subset of octagon-shaped pixel sensors 202 configured as white pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 87% to emphasize color performance. In some implementations, the quantity of octagon-shaped pixel sensors 202 configured as white pixel sensors may range from approximately 13% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 19, an example pixel sensor configuration 1915 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 19, an example pixel sensor configuration 1920 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 19, an example pixel sensor configuration 1925 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 19, an example pixel sensor configuration 1930 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

Figure 20:
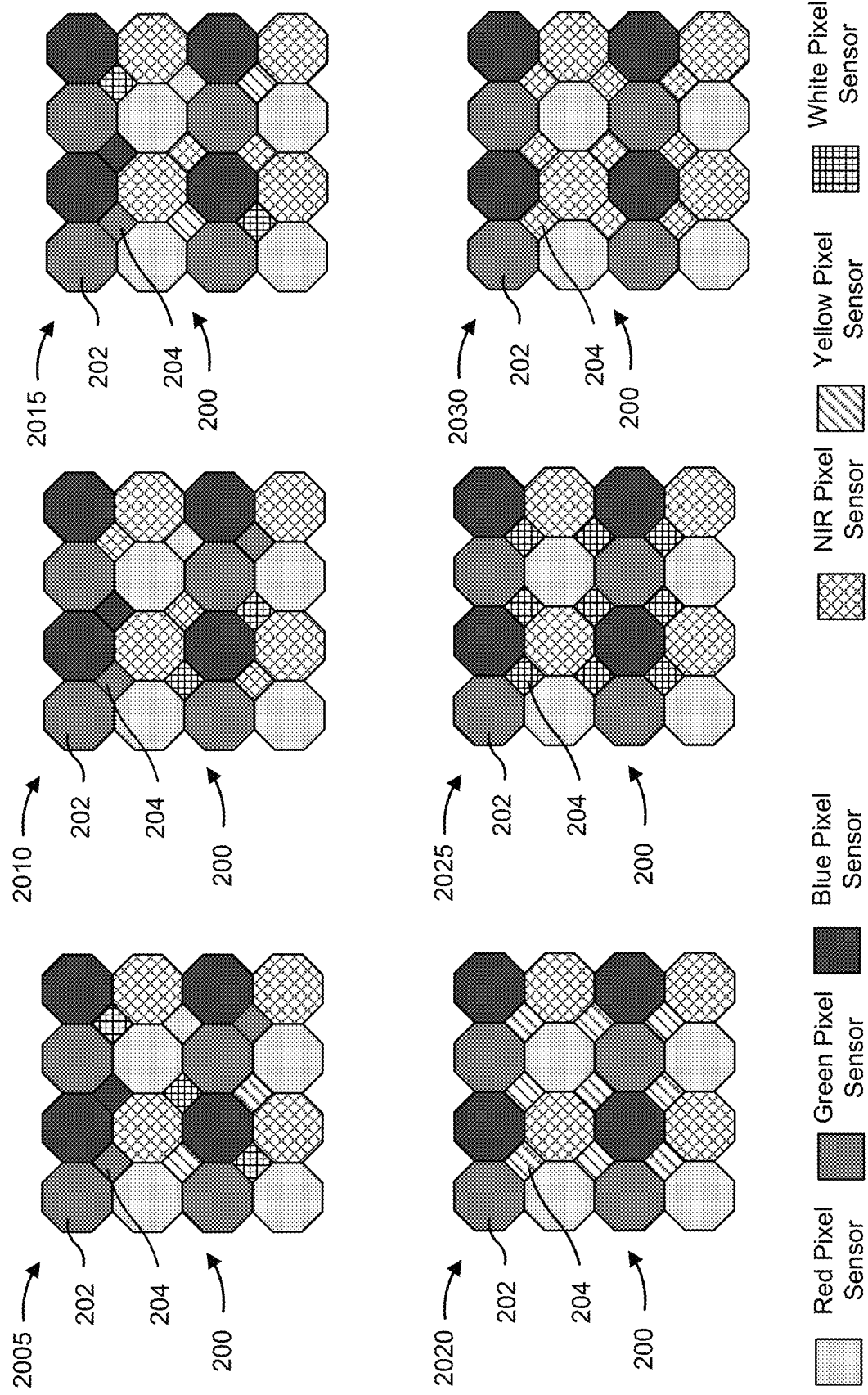

As shown in FIG. 20, an example pixel sensor configuration 2005 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 20, an example pixel sensor configuration 2010 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 20, an example pixel sensor configuration 2015 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 20, an example pixel sensor configuration 2020 may include a first subset of octagon-shaped pixel sensors 202 configured as red pixel sensors, green pixel sensors, and blue pixel sensors, a second subset of octagon-shaped pixel sensors 202 configured as NIR pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The square-shaped pixel sensors 204 may be configured as yellow pixel sensors to provide moderate to high blue light and green light performance increase.

As further shown in FIG. 20, an example pixel sensor configuration 2025 may include a first subset of octagon-shaped pixel sensors 202 configured as red pixel sensors, green pixel sensors, and blue pixel sensors, a second subset of octagon-shaped pixel sensors 202 configured as NIR pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The square-shaped pixel sensors 204 may be configured as white pixel sensors to provide moderate to high light sensitivity and brightness performance increase.

As further shown in FIG. 20, an example pixel sensor configuration 2030 may include a first subset of octagon-shaped pixel sensors 202 configured as red pixel sensors, green pixel sensors, and blue pixel sensors, a second subset of octagon-shaped pixel sensors 202 configured as NIR pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The square-shaped pixel sensors 204 may be configured as NIR pixel sensors to provide moderate to high contour sharpness and low-light performance increase.

Figure 21:
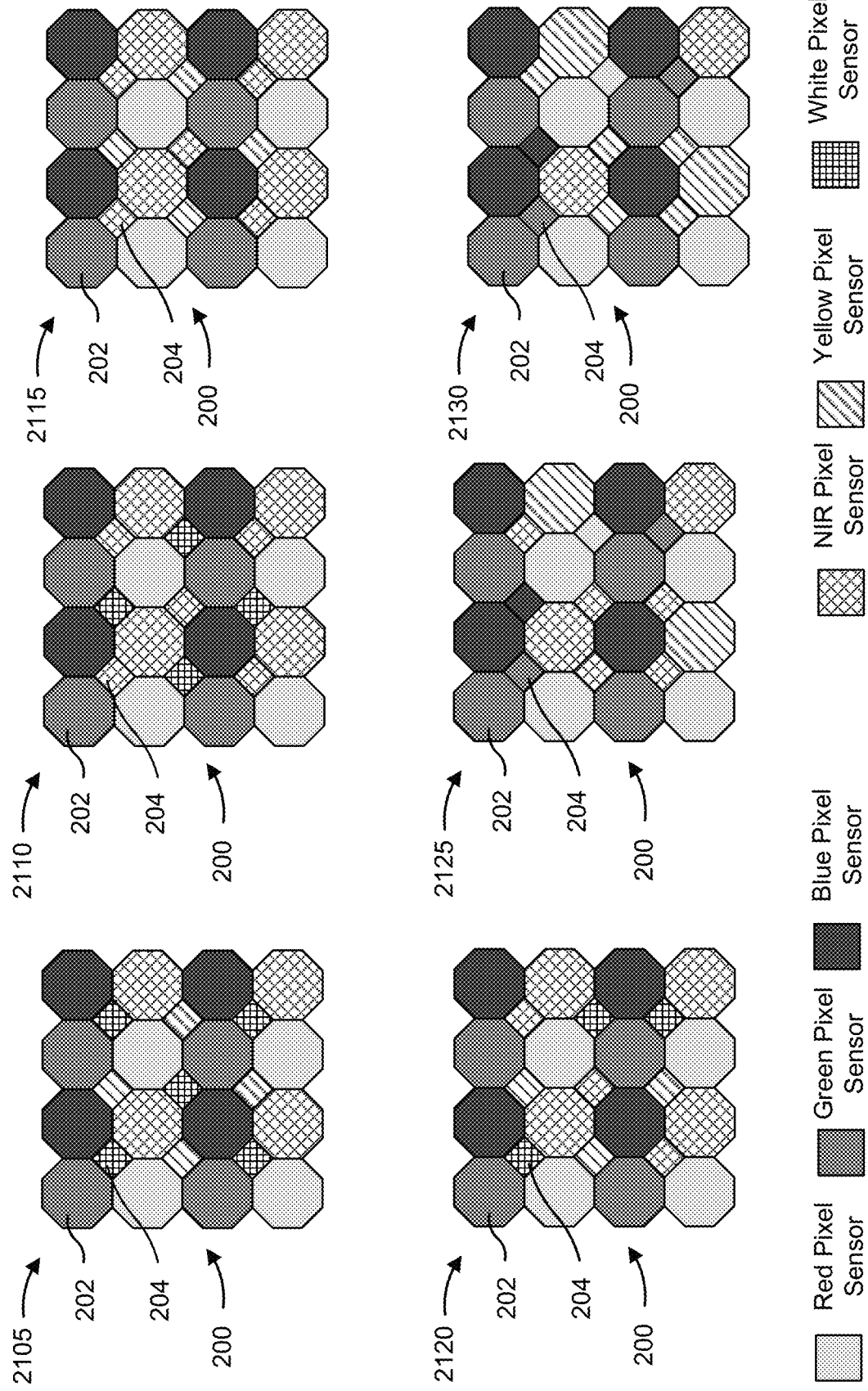

As shown in FIG. 21, an example pixel sensor configuration 2105 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 21, an example pixel sensor configuration 2110 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 21, an example pixel sensor configuration 2115 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 21, an example pixel sensor configuration 2120 may include a first subset of octagon-shaped pixel sensors 202 configured as red pixel sensors, green pixel sensors, and blue pixel sensors, a second subset of octagon-shaped pixel sensors 202 configured as NIR pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 94% to approximately 75% to emphasize color performance. In some implementations, the quantity of octagon-shaped pixel sensors 202 configured as NIR pixel sensors may range from approximately 50% to approximately 82% to emphasize contour sharpness and low-light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 21, an example pixel sensor configuration 2125 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 21, an example pixel sensor configuration 2130 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

Figure 22:
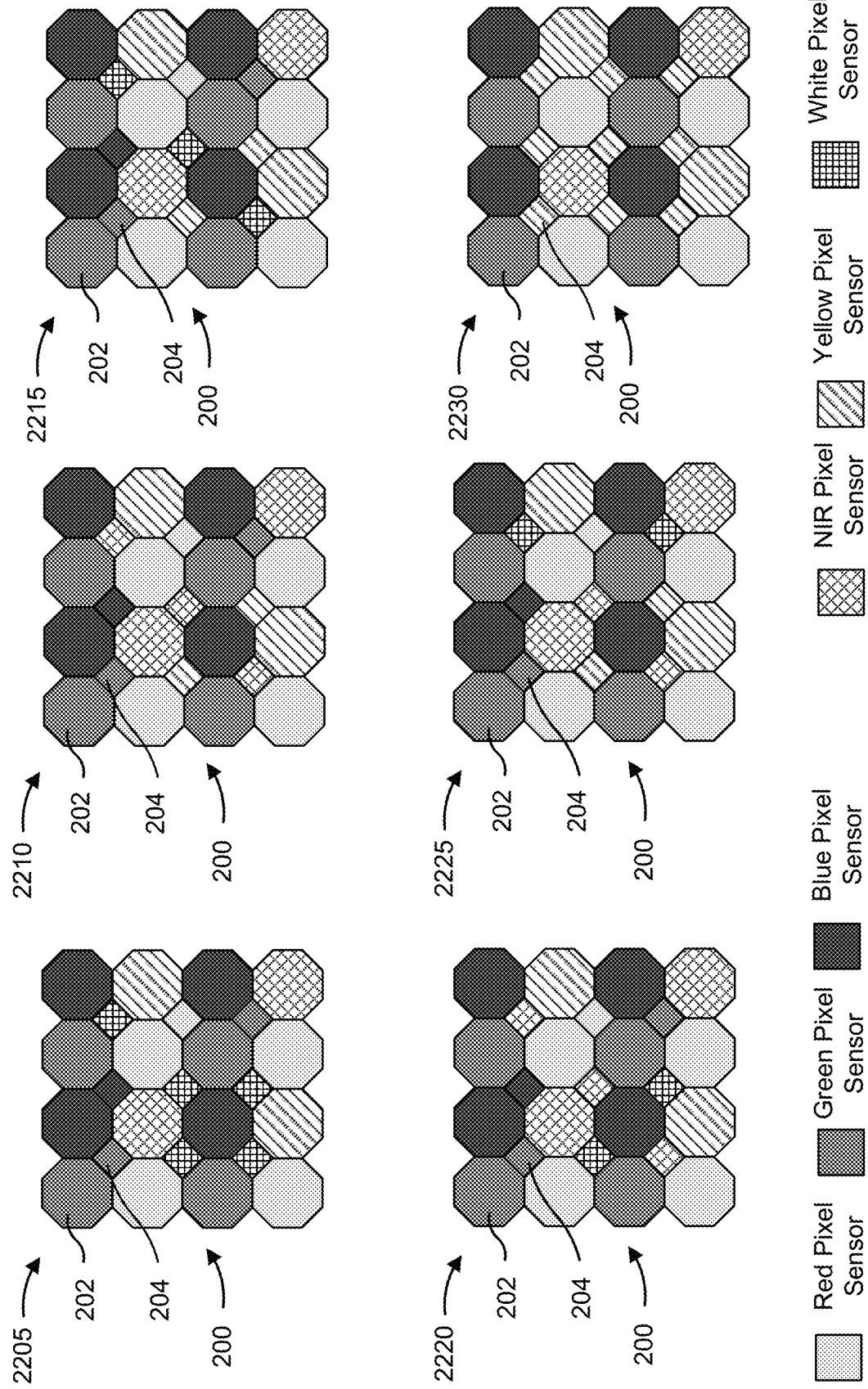

As shown in FIG. 22, an example pixel sensor configuration 2205 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 22, an example pixel sensor configuration 2210 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 22, an example pixel sensor configuration 2215 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as yellow pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 22, an example pixel sensor configuration 2220 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 22, an example pixel sensor configuration 2225 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as white pixel sensors, and a fourth subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 22, an example pixel sensor configuration 2230 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The square-shaped pixel sensors 204 may be configured as yellow pixel sensors to provide moderate to high blue light and green light performance increase.

Figure 23:
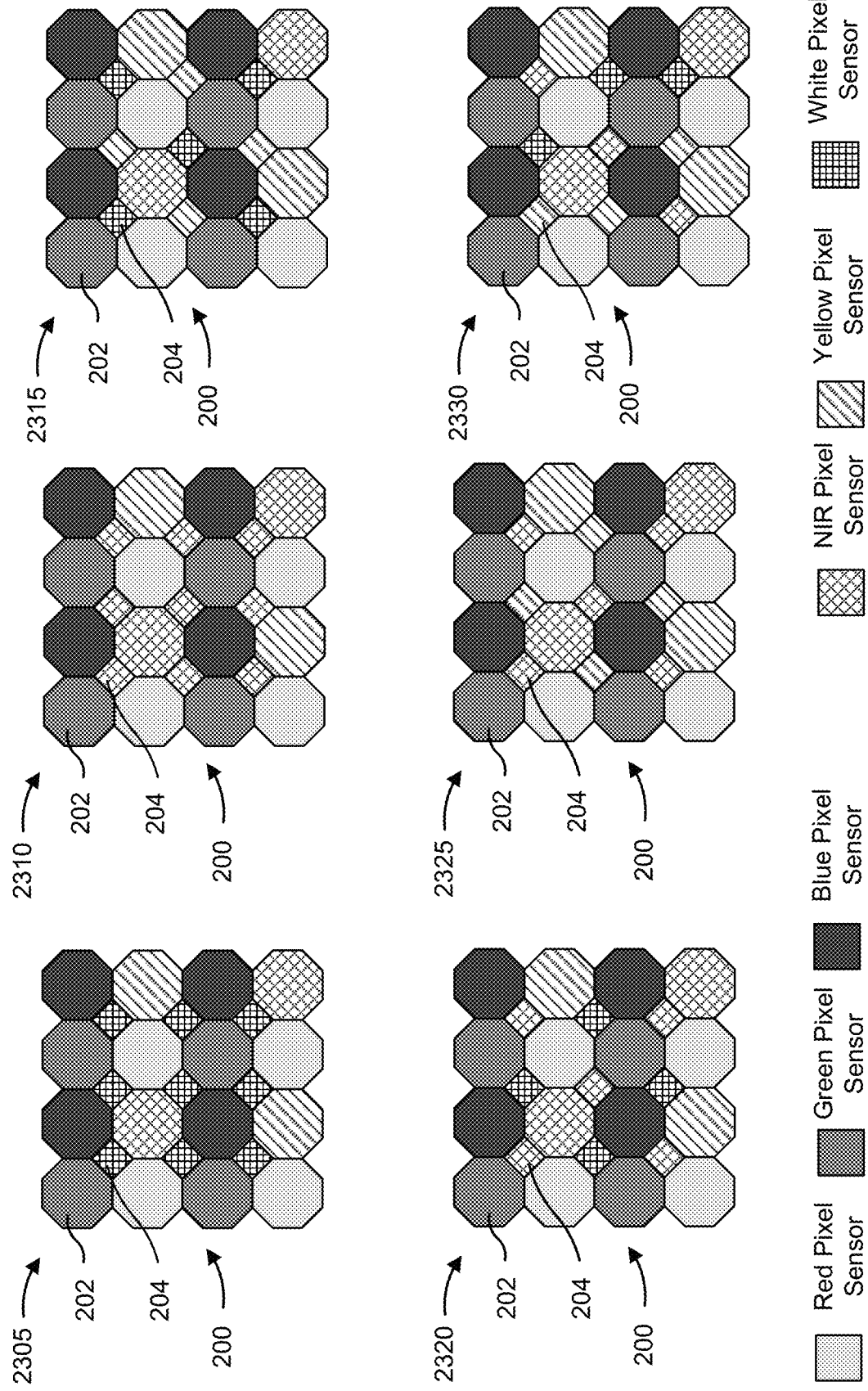

As shown in FIG. 23, an example pixel sensor configuration 2305 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The square-shaped pixel sensors 204 may be configured as white pixel sensors to provide moderate to high light sensitivity and brightness performance increase.

As further shown in FIG. 23, an example pixel sensor configuration 2310 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The square-shaped pixel sensors 204 may be configured as NIR pixel sensors to provide moderate to high contour sharpness and low-light performance increase.

As further shown in FIG. 23, an example pixel sensor configuration 2315 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 23, an example pixel sensor configuration 2320 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 23, an example pixel sensor configuration 2325 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 23, an example pixel sensor configuration 2330 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as yellow pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as NIR pixel sensors may range from approximately 50% to approximately 75% to emphasize contour sharpness and low-light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

Figure 24:
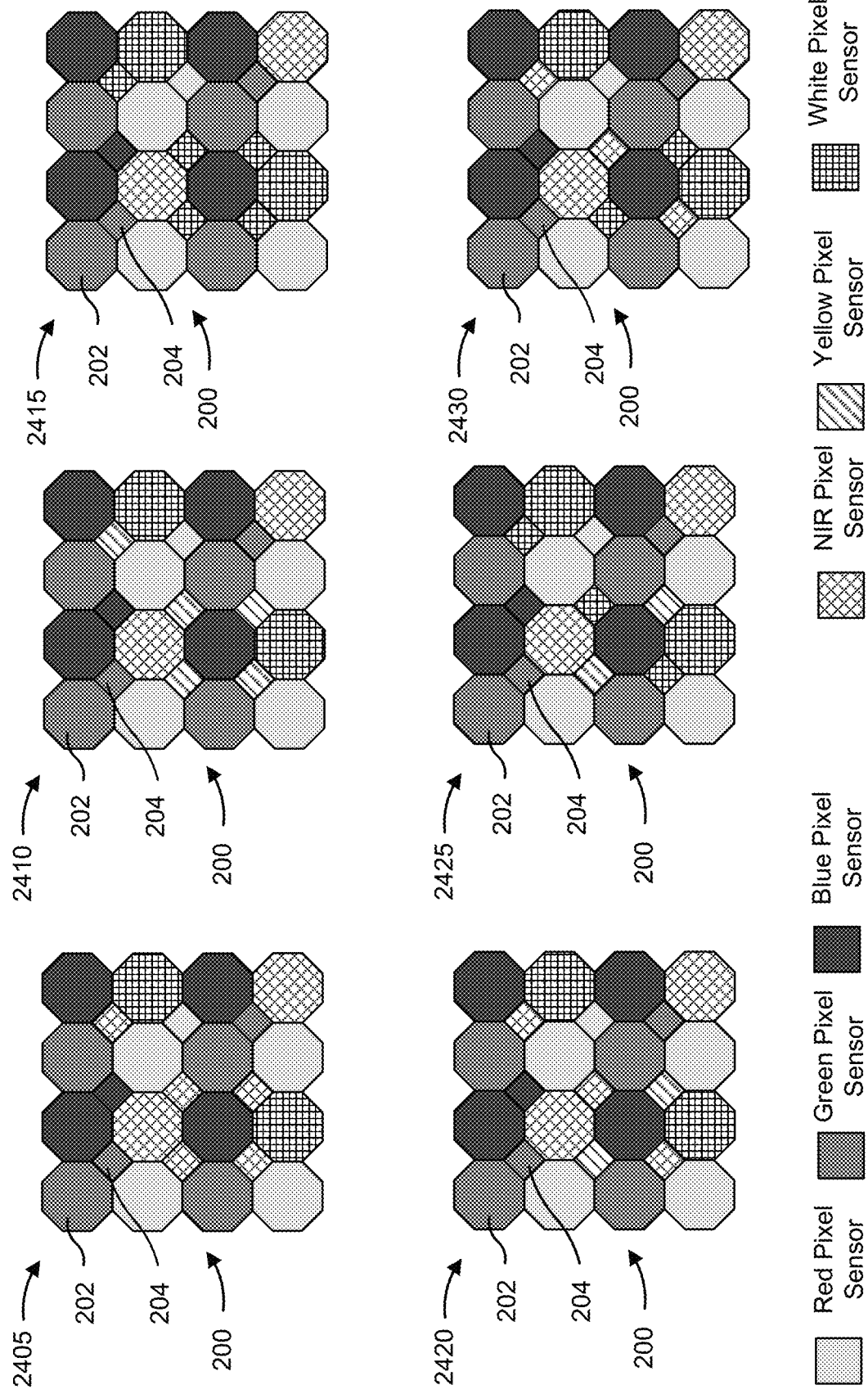

As shown in FIG. 24, an example pixel sensor configuration 2405 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 24, an example pixel sensor configuration 2410 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 24, an example pixel sensor configuration 2415 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 24, an example pixel sensor configuration 2420 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 24, an example pixel sensor configuration 2425 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 24, an example pixel sensor configuration 2430 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

Figure 25:
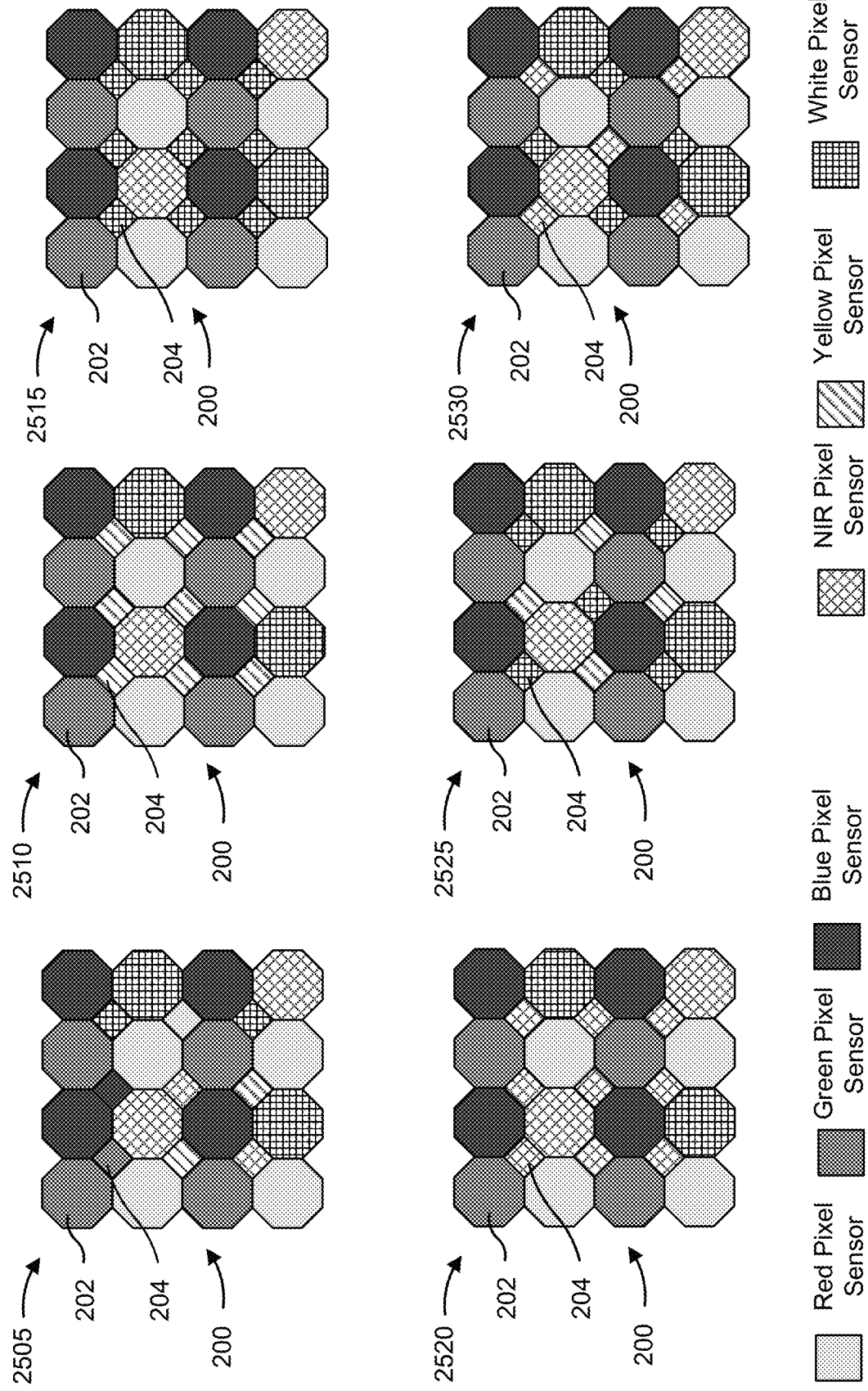

As shown in FIG. 25, an example pixel sensor configuration 2505 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 25, an example pixel sensor configuration 2510 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as yellow pixel sensors to provide moderate to high blue light and green light performance increase.

As further shown in FIG. 25, an example pixel sensor configuration 2515 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as white pixel sensors to provide moderate to high light sensitivity and brightness performance increase.

As further shown in FIG. 25, an example pixel sensor configuration 2520 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as NIR pixel sensors to provide moderate to high contour sharpness and low-light performance increase.

As further shown in FIG. 25, an example pixel sensor configuration 2525 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 25, an example pixel sensor configuration 2530 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

Figure 26:
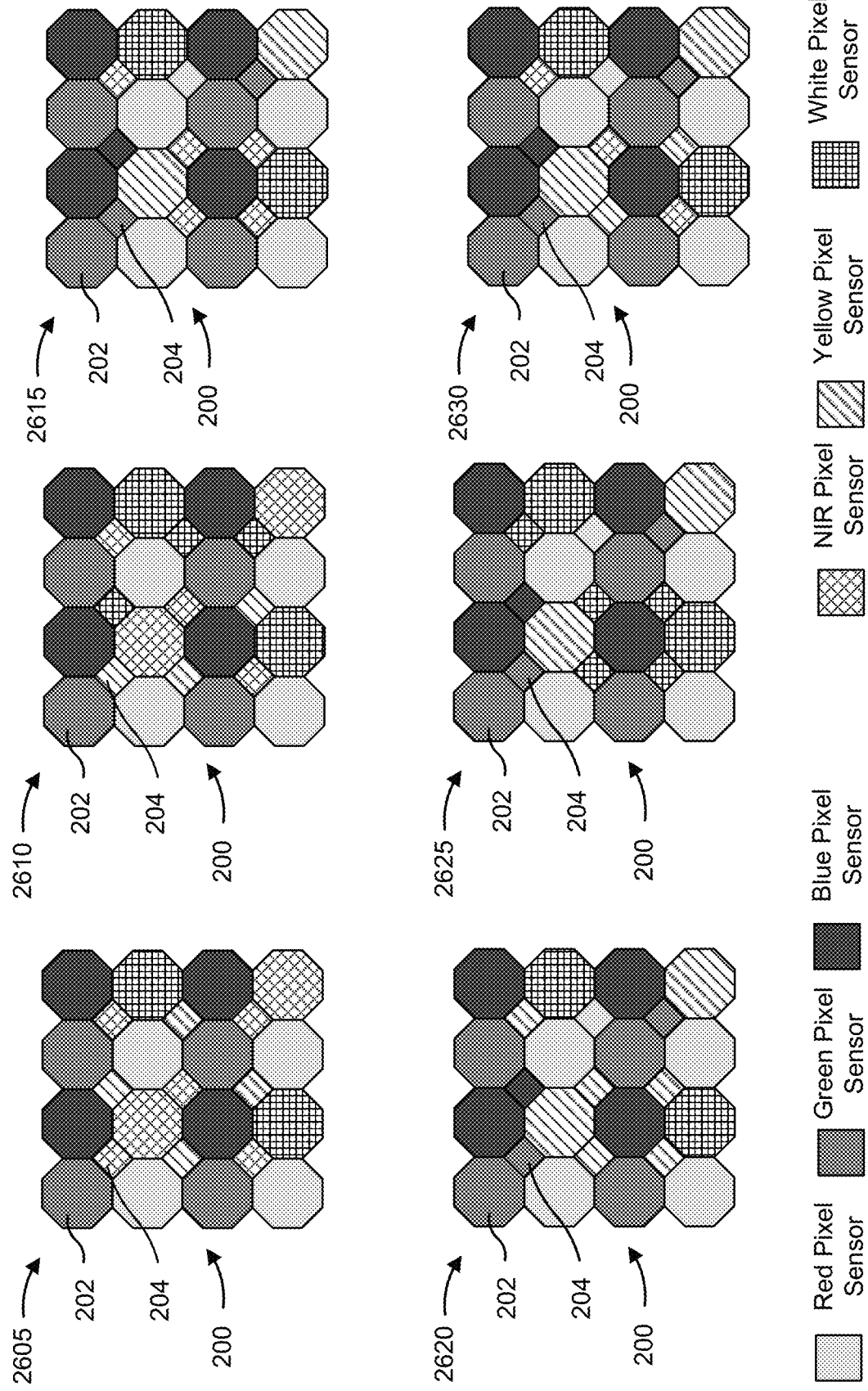

As shown in FIG. 26, an example pixel sensor configuration 2605 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 26, an example pixel sensor configuration 2610 may include a first subset of octagon-shaped pixel sensors 202 configured as red pixel sensors, green pixel sensors, and blue pixel sensors, a second subset of octagon-shaped pixel sensors 202 configured as NIR pixel sensors, a third subset of octagon-shaped pixel sensors 202 configured as white pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of octagon-shaped pixel sensors 202 configured as NIR pixel sensors may range from approximately 50% to approximately 75% to emphasize contour sharpness and low-light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 26, an example pixel sensor configuration 2615 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 26, an example pixel sensor configuration 2620 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

As further shown in FIG. 26, an example pixel sensor configuration 2625 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 26, an example pixel sensor configuration 2630 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

Figure 27:
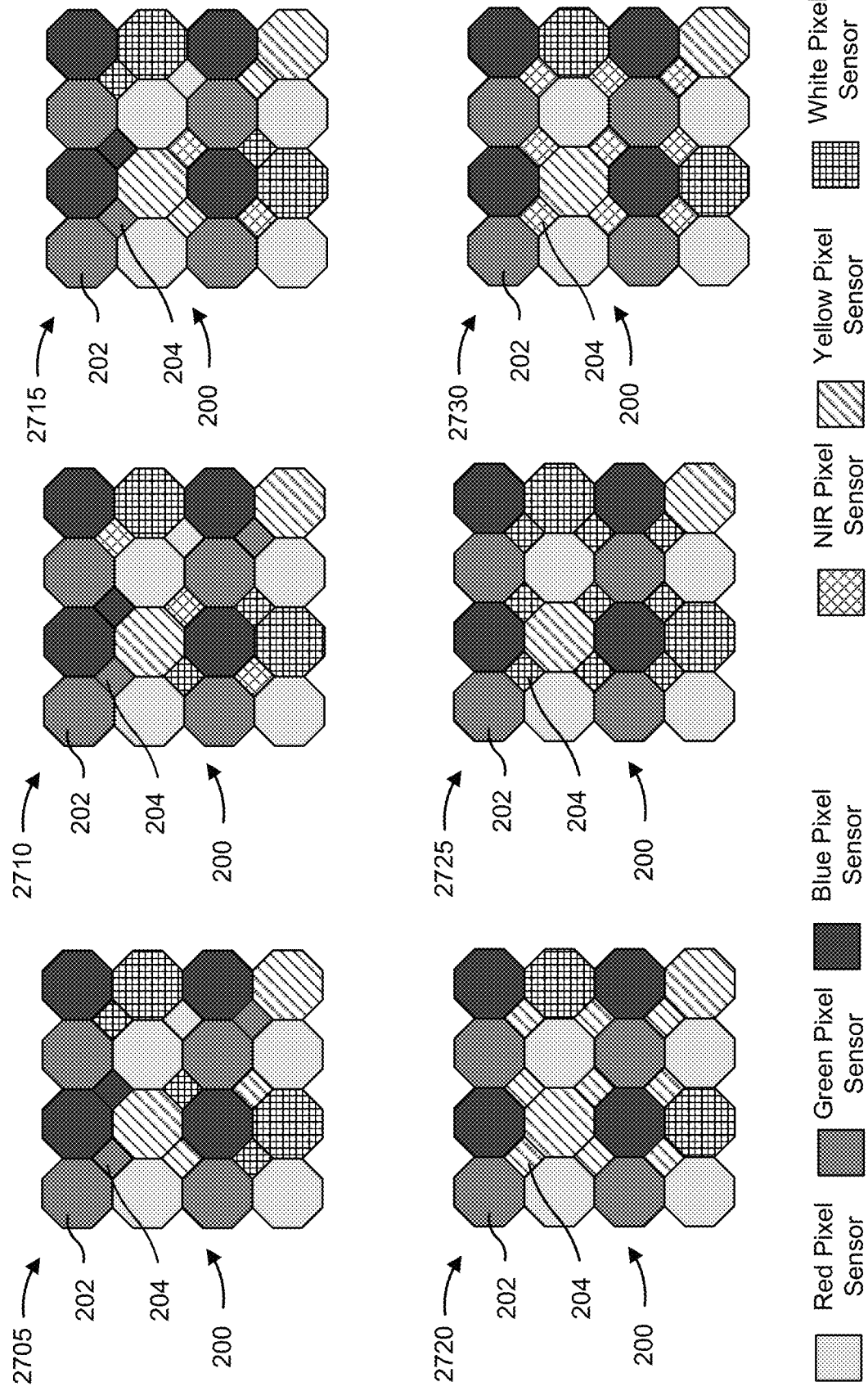

As shown in FIG. 27, an example pixel sensor configuration 2705 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 27, an example pixel sensor configuration 2710 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 27, an example pixel sensor configuration 2715 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as yellow pixel sensors, and a fourth subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 27, an example pixel sensor configuration 2720 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as yellow pixel sensors to provide moderate to high blue light and green light performance increase.

As further shown in FIG. 27, an example pixel sensor configuration 2725 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as white pixel sensors to provide moderate to high light sensitivity and brightness performance increase.

As further shown in FIG. 27, an example pixel sensor configuration 2730 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The square-shaped pixel sensors 204 may be configured as NIR pixel sensors to provide moderate to high contour sharpness and low-light performance increase.

Figure 28:
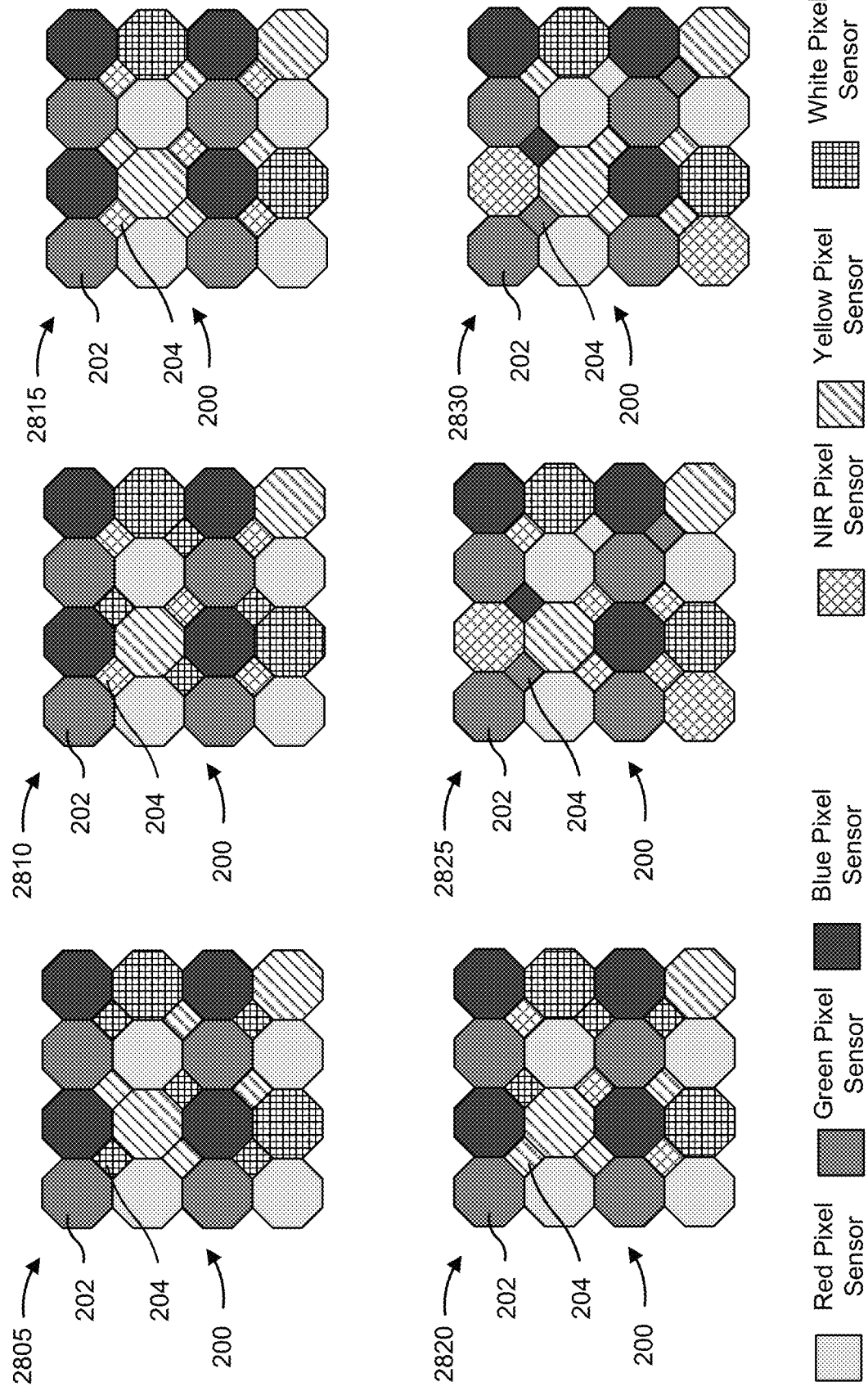

As shown in FIG. 28, an example pixel sensor configuration 2805 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 28, an example pixel sensor configuration 2810 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 28, an example pixel sensor configuration 2815 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 28, an example pixel sensor configuration 2820 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a first subset of square-shaped pixel sensors 204 configured as yellow pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of octagon-shaped pixel sensors 202 configured as yellow pixel sensors may range from approximately 13% to approximately 6% to emphasize blue light and green light performance. In some implementations, the quantity of octagon-shaped pixel sensors 202 configured as white pixel sensors may range from approximately 6% to approximately 38% to emphasize light sensitivity and brightness. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors

204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 28, an example pixel sensor configuration 2825 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 75% to emphasize color performance. In some implementations, the quantity of square-shaped pixel sensors 204 configured as NIR pixel sensors may range from approximately 50% to approximately 82% to emphasize contour sharpness and low-light performance.

As further shown in FIG. 28, an example pixel sensor configuration 2830 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as yellow pixel sensors may range from approximately 6% to approximately 13% to emphasize blue light and green light performance.

Figure 29:
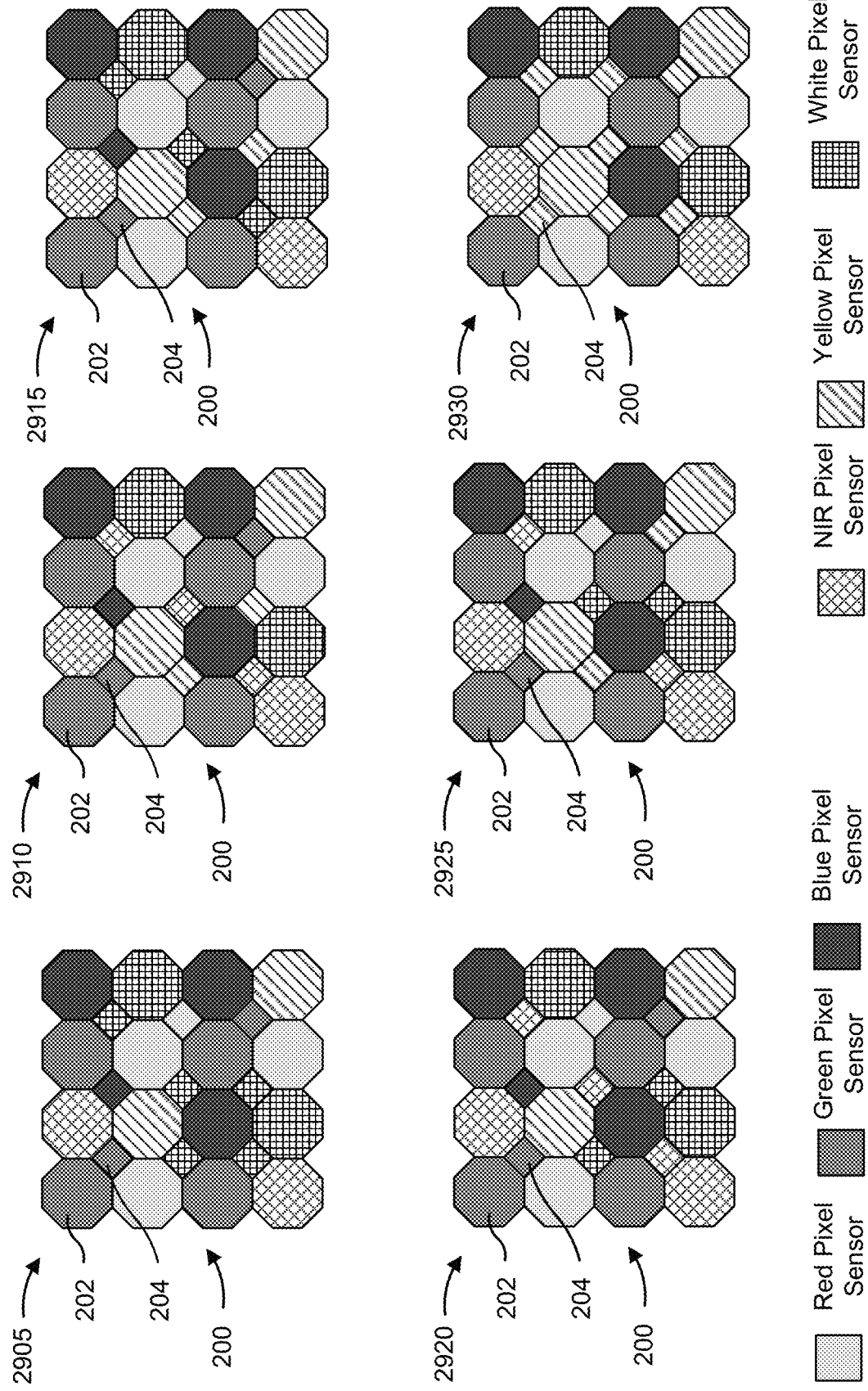

As shown in FIG. 29, an example pixel sensor configuration 2905 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 94% to approximately 87% to emphasize color performance. In some implementations, the quantity of square-shaped pixel sensors 204 configured as white pixel sensors may range from approximately 13% to approximately 38% to emphasize light sensitivity and brightness.

As further shown in FIG. 29, an example pixel sensor configuration 2910 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and NIR pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as NIR pixel sensors may range from approximately 50% to approximately 75% to emphasize contour sharpness and low-light performance.

As further shown in FIG. 29, an example pixel sensor configuration 2915 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as white pixel sensors, and a third subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 87% to approximately 68% to emphasize color performance, with the remaining percentage being configured as yellow pixel sensors and white pixel sensors. In some implementations, the quantity of square-shaped pixel sensors 204 configured as yellow pixel sensors may range from approximately 13% to approximately 6% to emphasize blue light and green light performance. In some implementations, the quantity of square-shaped pixel sensors 204 configured as white pixel sensors may range from approximately 6% to approximately 38% to emphasize light sensitivity and brightness.

As further shown in FIG. 29, an example pixel sensor configuration 2920 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, and a third subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 88% to approximately 75% to emphasize color performance, with the remaining percentage being configured as NIR pixel sensors and white pixel sensors. In some implementations, the quantity of square-shaped pixel sensors 204 configured as NIR pixel sensors may range from approximately 50% to approximately 75% to emphasize contour sharpness and low-light performance. In some implementations, the quantity of square-shaped pixel sensors 204 configured as white pixel sensors may range from approximately 6% to approximately 38% to emphasize light sensitivity and brightness.

As further shown in FIG. 29, an example pixel sensor configuration 2925 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as red pixel sensors, green pixel sensors, and blue pixel sensors, a second subset of square-shaped pixel sensors 204 configured as NIR pixel sensors, a third subset of square-shaped pixel sensors 204 configured as white pixel sensors, and a fourth subset of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. In some implementations, the quantity of square-shaped pixel sensors 204 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of square-shaped pixel sensors 204 configured as NIR pixel sensors may range from approximately 25% to approximately 70% to emphasize contour sharpness and low-light performance. In some implementations, the quantity of square-shaped pixel sensors 204 configured as white pixel sensors may range from approximately 6% to approximately 38% to emphasize light sensitivity and brightness. In some implementations, the quantity of square-shaped pixel sensors 204 configured as yellow pixel sensors may range from approximately 6% to approximately 13% to emphasize blue light and green light performance.

As further shown in FIG. 29, an example pixel sensor configuration 2930 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, and a plurality of square-shaped pixel sensors 204 configured as yellow pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as yellow pixel sensors to provide moderate to high blue light and green light performance increase.

Figure 30:
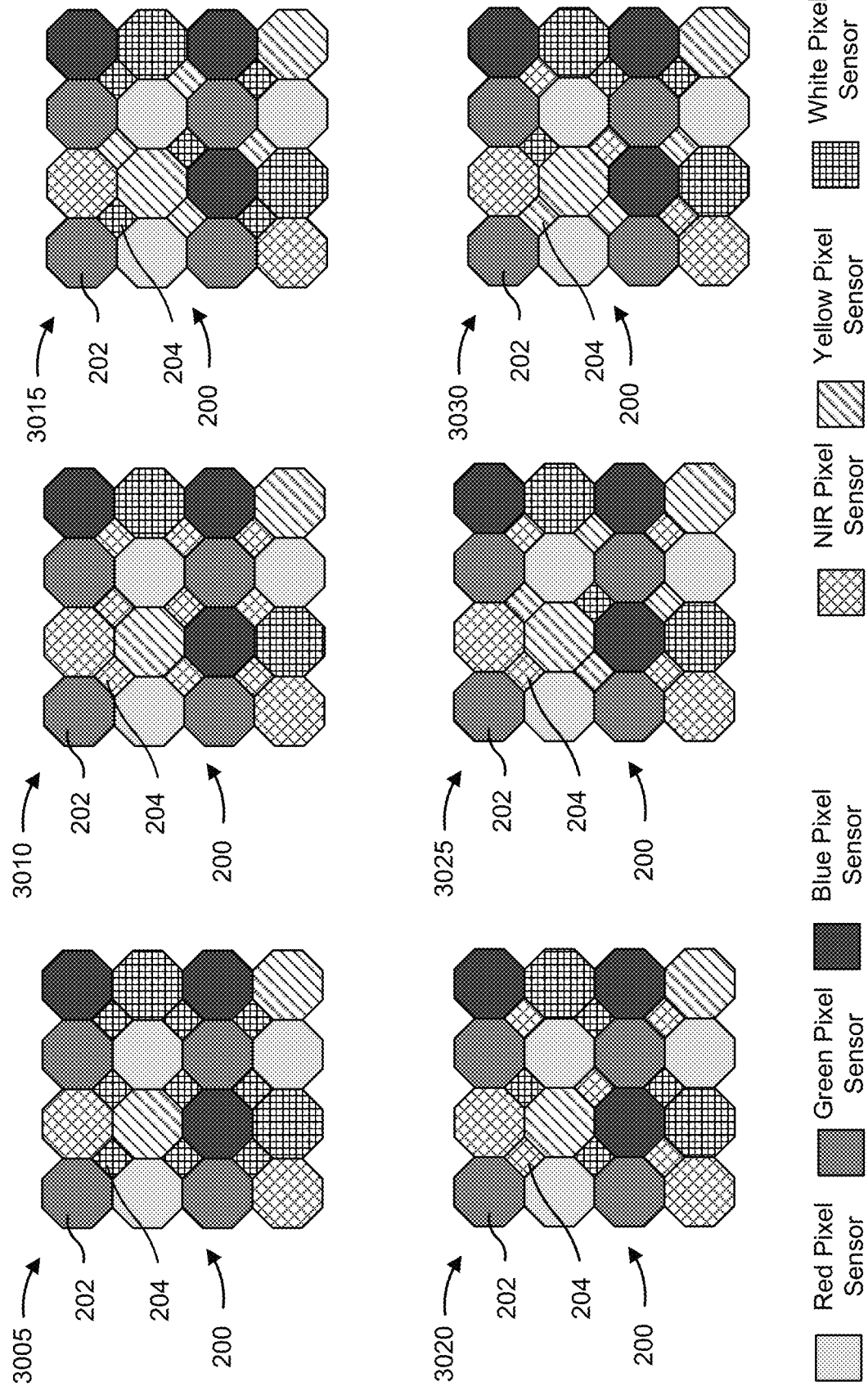

As shown in FIG. 30, an example pixel sensor configuration 3005 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, and a plurality of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as white pixel sensors to provide moderate to high light sensitivity and brightness performance increase.

As further shown in FIG. 30, an example pixel sensor configuration 3010 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, and a plurality of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The square-shaped pixel sensors 204 may be configured as NIR pixel sensors to provide moderate to high contour sharpness and low-light performance increase.

As further shown in FIG. 30, an example pixel sensor configuration 3015 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as yellow pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 30, an example pixel sensor configuration 3020 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as NIR pixel sensors, and a second subset of square-shaped pixel sensors 204 configured as white pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as white pixel sensors may be increased or decreased to respectively increase or decrease the light sensitivity and brightness increase provided by the square-shaped pixel sensors 204.

As further shown in FIG. 30, an example pixel sensor configuration 3025 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as yellow pixel sensors, and a second subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

As further shown in FIG. 30, an example pixel sensor configuration 3030 may include a first subset of octagon-shaped pixel sensors 202 configured as red pixel sensors, green pixel sensors, and blue pixel sensors, a second subset of octagon-shaped pixel sensors 202 configured as yellow pixel sensors, a third subset of octagon-shaped pixel sensors 202 configured as white pixel sensors, a fourth subset of octagon-shaped pixel sensors 202 configured as NIR pixel sensors, a first subset of square-shaped pixel sensors 204 configured as yellow pixel sensors, a second subset of square-shaped pixel sensors 204 configured as white pixel sensors, and a third subset of square-shaped pixel sensors 204 configured as NIR pixel sensors. In some implementations, the quantity of octagon-shaped pixel sensors 202 configured as red pixel sensors, green pixel sensors, and blue pixel sensors may range from approximately 88% to approximately 68% to emphasize color performance, with the remaining percentage being configured as NIR pixel sensors, white pixel sensors, and yellow pixel sensors. In some implementations, the quantity of octagon-shaped pixel sensors 202 configured as NIR pixel sensors may range from approximately 25% to approximately 70% to emphasize contour sharpness and low-light performance. In some implementations, the quantity of octagon-shaped pixel sensors 202 configured as white pixel sensors may range from approximately 6% to approximately 38% to emphasize light sensitivity and brightness. In some implementations, the quantity of octagon-shaped pixel sensors 202 configured as yellow pixel sensors may range from approximately 6% to approximately 13% to emphasize blue light and green light performance. The quantity of square-shaped pixel sensor 204 configured as white pixel sensors may be increased or decreased to respectively increase or decrease the light sensitivity and brightness increase provided by the square-shaped pixel sensors 204. The quantity of square-shaped pixel sensor 204 configured as NIR pixel sensors may be increased or decreased to respectively increase or decrease the amount of contour sharpness and low-light performance provided by the square-shaped pixel sensors 204. The quantity of square-shaped pixel sensor 204 configured as yellow pixel sensors may be increased or decreased to respectively increase or decrease the blue light and green light performance increase provided by the square-shaped pixel sensors 204.

In some implementations, the pixel array 200 may be configured according to an example pixel sensor configuration illustrated in one or more of FIGS. 3-30 (or in another example pixel sensor configuration) such that the pixel array 200 satisfies one or more performance parameters and/or attributes. The one or more performance parameters and/or attributes may include, for example, a color saturation parameter, a noise parameter, a contrast parameter, color accuracy, a brightness parameter, a hue parameter, light sensitivity parameter, a low light performance parameter, a blue light performance parameter, a green light performance parameter, a contour sharpness parameter, an image sensor size, a pixel sensor density, and/or the like.

In some implementations, the color saturation performance and/or the color accuracy performance of the pixel array 200 may increase as the quantity of octagon-shaped pixel sensors 202 and/or the quantity of square-shaped pixel sensors 204 configured as red pixel sensors, green pixel sensors, and blue pixel sensors are increased. In some implementations, a given quantity of octagon-shaped pixel sensors 202 configured as red pixel sensors, green pixel sensors, and blue pixel sensors may provide greater color saturation performance and/or greater color accuracy performance relative to the same quantity of square-shaped pixel sensors 204 configured as red pixel sensors, green pixel sensors, and blue pixel sensors due to the size or area of the octagon-shaped pixel sensors 202 being physically larger relative to the size or area of the square-shaped pixel sensors 204.

In some implementations, the blue light performance and/or the green light performance of the pixel array 200 may increase as the quantity of octagon-shaped pixel sensors 202 and/or the quantity of square-shaped pixel sensors 204 configured as yellow pixel sensors are increased. In some implementations, a given quantity of octagon-shaped pixel sensors 202 configured as yellow pixel sensors may provide greater blue light performance and/or green light performance relative to the same quantity of square-shaped pixel sensors 204 configured as yellow pixel sensors due to the size or area of the octagon-shaped pixel sensors 202 being physically larger relative to the size or area of the square-shaped pixel sensors 204.

In some implementations, the low light performance and/or the contour sharpness performance of the pixel array 200 may increase as the quantity of octagon-shaped pixel sensors 202 and/or the quantity of square-shaped pixel sensors 204 configured as NIR pixel sensors are increased. In some implementations, a given quantity of octagon-shaped pixel sensors 202 configured as NIR pixel sensors may provide greater low light performance and/or contour sharpness performance relative to the same quantity of square-shaped pixel sensors 204 configured as NIR pixel sensors due to the size or area of the octagon-shaped pixel sensors 202 being physically larger relative to the size or area of the square-shaped pixel sensors 204.

In some implementations, the light sensitivity performance and/or the brightness performance of the pixel array 200 may increase as the quantity of octagon-shaped pixel sensors 202 and/or the quantity of square-shaped pixel sensors 204 configured as white pixel sensors are increased. In some implementations, a given quantity of octagon-shaped pixel sensors 202 configured as white pixel sensors may provide greater light sensitivity performance and/or brightness performance relative to the same quantity of square-shaped pixel sensors 204 configured as white pixel sensors due to the size or area of the octagon-shaped pixel sensors 202 being physically larger relative to the size or area of the square-shaped pixel sensors 204.

In some implementations, the sizes (e.g., side length(s) and/or widths) of octagon-shaped pixel sensors 202 may be the same in two or more regions of a pixel array and/or the sizes (e.g., side length(s) or widths) of square-shaped pixel sensors 204 may be the same in two or more regions of the pixel array. In some implementations, the size ratios or percentages between octagon-shaped pixel sensors 202 and square-shaped pixel sensors 204 may be different in two or more regions of a pixel array. In some implementations, the sizes ratios or percentages between octagon-shaped pixel sensors 202 and square-shaped pixel sensors 204 may be the same in two or more regions of a pixel array.

In some implementations, a quantity of octagon-shaped pixel sensors 202 may be different in two or more regions of a pixel array and/or a quantity of square-shaped pixel sensors 204 may be different in two or more regions of a pixel array. In some implementations, a quantity of octagon-shaped pixel sensors 202 may be the same in two or more regions of a pixel array and/or a quantity of square-shaped pixel sensors 204 may be the same in two or more regions of a pixel array. In some implementations, a pixel array may include a region of similarly configured octagon-shaped pixel sensors 202 and/or square-shaped pixel sensors 204, as well as a region having a non-uniform arrangement of octagon-shaped pixel sensors 202 and/or square-shaped pixel sensors 204.

As indicated above, FIGS. 3-30 are provided as examples. Other examples may differ from what is described with regard to FIGS. 3-30. The configuration of the octagon-shaped pixel sensors 202 and/or the configuration of the square-shaped pixel sensors 204 described above in connection with FIGS. 3-30 may be arranged according to the examples described above and/or arranged according to other examples to achieve or satisfy one or more performance parameters and/or attributes, such as color saturation, color accuracy, noise, contrast, brightness, hue, light sensitivity, low light performance, blue light performance, green light performance, contour sharpness, image sensor size, pixel sensor density, and/or the like.

Figure 31:
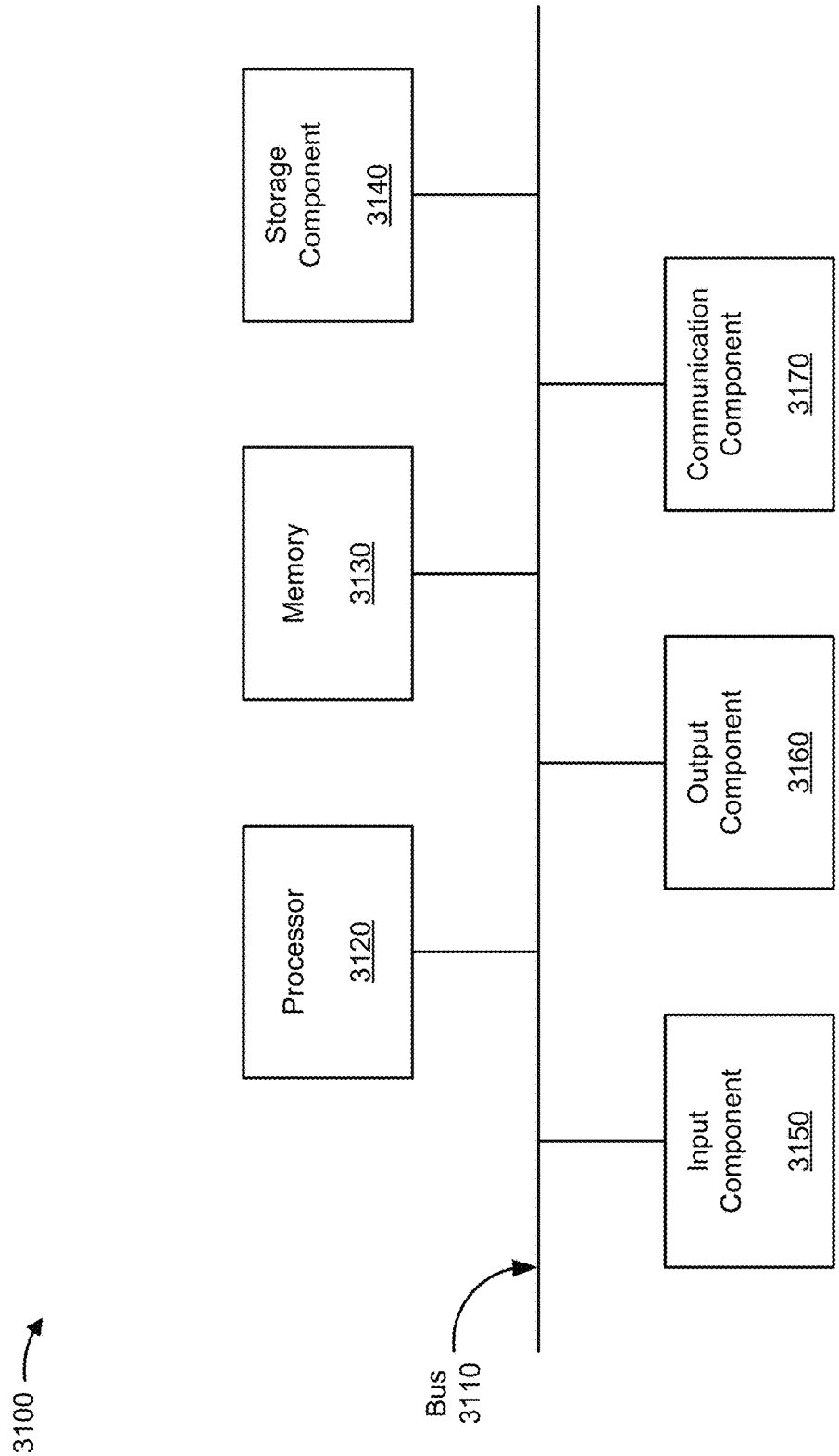
FIG. 31 is a diagram of example components of one or more devices of FIG. 1.

FIG. 31 is a diagram of example components of a device 3100. In some implementations, one or more of the semiconductor processing tools 102-112 and/or wafer/die transport tool 114 may include one or more devices 3100 and/or one or more components of device 3100. As shown in FIG. 31, device 3100 may include a bus 3110, a processor 3120, a memory 3130, a storage component 3140, an input component 3150, an output component 3160, and a communication component 3170.

Bus 3110 includes a component that enables wired and/or wireless communication among the components of device 3100. Processor 3120 includes a central processing unit, a graphics processing unit, a microprocessor, a controller, a microcontroller, a digital signal processor, a field-programmable gate array, an application-specific integrated circuit, and/or another type of processing component. Processor 3120 is implemented in hardware, firmware, or a combination of hardware and software. In some implementations, processor 3120 includes one or more processors capable of being programmed to perform a function. Memory 3130 includes a random access memory, a read only memory, and/or another type of memory (e.g., a flash memory, a magnetic memory, and/or an optical memory).

Storage component 3140 stores information and/or software related to the operation of device 3100. For example, storage component 3140 may include a hard disk drive, a magnetic disk drive, an optical disk drive, a solid state disk drive, a compact disc, a digital versatile disc, and/or another type of non-transitory computer-readable medium. Input component 3150 enables device 3100 to receive input, such as user input and/or sensed inputs. For example, input component 3150 may include a touch screen, a keyboard, a keypad, a mouse, a button, a microphone, a switch, a sensor, a global positioning system component, an accelerometer, a gyroscope, an actuator, and/or the like. Output component 3160 enables device 3100 to provide output, such as via a display, a speaker, and/or one or more light-emitting diodes. Communication component 3170 enables device 3100 to communicate with other devices, such as via a wired connection and/or a wireless connection. For example, communication component 3170 may include a receiver, a transmitter, a transceiver, a modem, a network interface card, an antenna, and/or the like.

Device 3100 may perform one or more processes described herein. For example, a non-transitory computer-readable medium (e.g., memory 3130 and/or storage component 3140) may store a set of instructions (e.g., one or more instructions, code, software code, program code, and/or the like) for execution by processor 3120. Processor 3120 may execute the set of instructions to perform one or more processes described herein. In some implementations, execution of the set of instructions, by one or more processors 3120, causes the one or more processors 3120 and/or the device 3100 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 31 are provided as an example. Device 3100 may include additional components, fewer components, different components, or differently arranged components than those shown in FIG. 31. Additionally, or alternatively, a set of components (e.g., one or more components) of device 3100 may perform one or more functions described as being performed by another set of components of device 3100.

FIG. 32 is a flowchart of an example process 3200 associated with forming a pixel array. In some implementations, one or more process blocks of FIG. 32 may be performed by one or more semiconductor processing tools (e.g., one or more of the semiconductor processing tools 102-112). Additionally, or alternatively, one or more process blocks of FIG. 32 may be performed by one or more components of device 3100, such as processor 3120, memory 3130, storage component 3140, input component 3150, output component 3160, and/or communication component 3170.

As shown in FIG. 32, process 3200 may include forming a plurality of octagon-shaped pixel sensors of a pixel array to include a first set of octagon-shaped pixel sensors configured to sense incident light in a first visible light wavelength range associated with blue light, a second set of octagon-shaped pixel sensors configured to sense incident light in a second visible light wavelength range associated with red light, a third set of octagon-shaped pixel sensors configured to sense incident light in a third visible light wavelength range associated with green light, and at least one of a fourth set of octagon-shaped pixel sensors configured to sense incident light in a fourth visible light wavelength range associated with yellow light, a fifth set of octagon-shaped pixel sensors configured to sense incident light for all visible light wavelengths, or a sixth set of octagon-shaped pixel sensors configured to sense incident light in an NIR wavelength range (block 3210). For example, one or more semiconductor processing tools (e.g., one or more of the semiconductor processing tools 102-112) may form a plurality of octagon-shaped pixel sensors 202 of a pixel array 200 to include a first set of octagon-shaped pixel sensors 202 configured to sense incident light in a first visible light wavelength range associated with blue light, a second set of octagon-shaped pixel sensors 202 configured to sense incident light in a second visible light wavelength range associated with red light, a third set of octagon-shaped pixel sensors 202 configured to sense incident light in a third visible light wavelength range associated with green light, and at least one of a fourth set of octagon-shaped pixel sensors 202 configured to sense incident light in a fourth visible light wavelength range associated with yellow light, a fifth set of octagon-shaped pixel sensors 202 configured to sense incident light for all visible light wavelengths, or a sixth set of octagon-shaped pixel sensors 202 configured to sense incident light in an NIR wavelength range, as described above.

As further shown in FIG. 32, process 3200 may include forming a plurality of square-shaped pixel sensors, interspersed with the plurality of octagon-shaped pixel sensors in the pixel array, to include a first set of square-shaped pixel sensors configured to sense incident light in the first visible light wavelength range associated with blue light, a second set of square-shaped pixel sensors configured to sense incident light in the second visible light wavelength range associated with red light, a third set of square-shaped pixel sensors configured to sense incident light in the third visible light wavelength range associated with green light, and at least one of a fourth set of square-shaped pixel sensors configured to sense incident light in the fourth visible light wavelength range associated with yellow light, a fifth set of square-shaped pixel sensors configured to sense incident light for all visible light wavelengths, or a sixth set of square-shaped pixel sensors configured to sense incident light in the NIR wavelength range (block 3220). For example, one or more semiconductor processing tools (e.g., one or more of the semiconductor processing tools 102-112) may form a plurality of square-shaped pixel sensors 204, interspersed with the plurality of octagon-shaped pixel sensors 202 in the pixel array 200, to include a first set of square-shaped pixel sensors 204 configured to sense incident light in the first visible light wavelength range associated with blue light, a second set of square-shaped pixel sensors 204 configured to sense incident light in the second visible light wavelength range associated with red light, a third set of square-shaped pixel sensors configured 204 to sense incident light in the third visible light wavelength range associated with green light, and at least one of a fourth set of square-shaped pixel sensors 204 configured to sense incident light in the fourth visible light wavelength range associated with yellow light, a fifth set of square-shaped pixel sensors 204 configured to sense incident light for all visible light wavelengths, or a sixth set of square-shaped pixel sensors 204 configured to sense incident light in the NIR wavelength range, as described above.

Process 3200 may include additional implementations, such as any single implementation or any combination of implementations described below and/or in connection with one or more other processes described elsewhere herein.

In a first implementation, at least one of forming the plurality of octagon-shaped pixel sensors includes forming the plurality of octagon-shaped pixel sensors 202 to include a quantity, of the fourth set of octagon-shaped pixel sensors 202 configured to sense incident light in the fourth visible light wavelength range associated with yellow light, that satisfies a blue light performance parameter and a green light performance parameter, or forming the plurality of square-shaped pixel sensors includes forming the plurality of square-shaped pixel sensors 204 to include a quantity, of the fourth set of square-shaped pixel sensors 204 configured to sense incident light in the fourth visible light wavelength range associated with yellow light, that satisfies the blue light performance parameter and the green light performance parameter.

In a second implementation, alone or in combination with the first implementation, at least one of forming the plurality of octagon-shaped pixel sensors includes forming the plurality of octagon-shaped pixel sensors 202 to include a quantity, of the fifth set of octagon-shaped pixel sensors 202 configured to sense incident light for all visible light wavelengths, that satisfies a sensitivity parameter and a brightness parameter, or forming the plurality of square-shaped pixel sensors includes forming the plurality of square-shaped pixel sensors 204 to include a quantity, of the fifth set of square-shaped pixel sensors 204 configured to sense incident light for all visible light wavelengths, that satisfies the sensitivity parameter and the brightness parameter.

In a third implementation, alone or in combination with one or more of the first and second implementations, at least one of forming the plurality of octagon-shaped pixel sensors includes forming the plurality of octagon-shaped pixel sensors 202 to include a quantity, of the sixth set of octagon-shaped pixel sensors 202 configured to sense incident light in the NIR wavelength range, that satisfies a low light performance parameter and a contour sharpness parameter, or forming the plurality of square-shaped pixel sensors includes forming the plurality of square-shaped pixel sensors 204 to include a quantity, of the sixth set of square-shaped pixel sensors 204 configured to sense incident light in the NIR wavelength range, that satisfies the low light performance parameter and the contour sharpness parameter.

Forming the plurality of octagon-shaped pixel sensors 202 and the plurality of square-shaped pixel sensors 204 may include various semiconductor process techniques performed by various semiconductor processing tools. Each of the plurality of octagon-shaped pixel sensors 202 and the plurality of square-shaped pixel sensors 204 may include various layers and/or semiconductor structures configured to collect and/or absorb incident light. For example, each of the plurality of octagon-shaped pixel sensors 202 and the plurality of square-shaped pixel sensors 204 may include a substrate (e.g., a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light).

A semiconductor processing tool (e.g., the ion implantation tool 112) may form photodiodes for each of the plurality of octagon-shaped pixel sensors 202 and the plurality of square-shaped pixel sensors 204 by doping the substrate with a plurality of types of ions to form a p-n junction or a PIN junction (e.g., a junction between a p-type portion, an intrinsic (or undoped) type portion, and an n-type portion) through diffusion or ion implantation. For example, the substrate may be doped with an n-type dopant to form a first portion (e.g., an n-type portion) of the photodiode and a p-type dopant to form a second portion (e.g., a p-type portion) of the photodiode. The photodiode may be configured to absorb photons of incident light. The absorption of photons causes the photodiode to accumulate a charge (referred to as a photocurrent) due to the photoelectric effect. Here, photons bombard the photodiode, which causes emission of electrons of the photodiode. The emission of electrons causes the formation of electron-hole pairs, where the electrons migrate toward the cathode of the photodiode and the holes migrate toward the anode, which produces the photocurrent.

One or more semiconductor processing tools may form deep trench isolation (DTI) structures on each side of the photodiodes to provide optical isolation between adjacent pixel sensors and to reduce optical crosstalk between adjacent pixel sensors. The DTI structures may be formed by coating the substrate with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the DTI structures into the substrate (e.g., using the etching tool 108) based on the pattern in the photoresist. In some implementations, the DTI structures may be filled with an oxide material such as a silicon oxide (SiII) or another dielectric material (e.g., using the deposition tool 102) and planarized (e.g., using the planarization tool 110).

A semiconductor processing tool (e.g., the deposition tool 102) may form an antireflective coating over the substrate.

A semiconductor processing tool (e.g., the deposition tool 102) may form a filter layer above the ARC layer. In some implementations, a semiconductor processing tool may deposit the filter layer using a CVD technique, a PVD technique, an ALD technique, or another type of deposition technique. The filter layer may include an array of color filter regions, which includes a color filter for each visible light pixel sensor in the pixel array. In this way, the color filter region for each visible light pixel sensor filters the color of the visible light pixel sensor by allowing a particular wavelength of the incident light to pass to a corresponding photodiode of the visible light pixel sensor.

A color filter region may, for example, be a blue color filter region that permits the portion of incident light near a 450 nanometer wavelength to pass and blocks other wavelengths from passing, which may define a blue pixel sensor of the pixel array 200. Another color filter region may, for example, be a green color filter region that permits the portion of incident light near a 550 nanometer wavelength to pass and blocks other wavelengths from passing, which may define a green pixel sensor of the pixel array 200. Another color filter region may, for example, be a red color filter region that permits the portion of incident light near a 650 nanometer wavelength to pass and blocks other wavelengths from passing, which may define a red pixel sensor of the pixel array 200. Another color filter region may, for example, be a yellow color filter region that permits the portion of incident light near a 580 nanometer wavelength to pass and blocks other wavelengths from passing, which may define a yellow pixel sensor of the pixel array 200.

The filter layer may also include one or more of NIR bandpass filters that define one or more NIR light pixel sensors in the pixel array 200. An NIR bandpass filter may allow the portion of incident light in an NIR wavelength range to pass while blocking visible light from passing. A color filter region may be omitted for white pixel sensors of the pixel array 200 to permit all wavelengths of visible light to pass through the filter layer.

A semiconductor processing tool (e.g., the deposition tool 102) may form a micro-lens layer including a plurality of micro-lenses is formed over and/or on the filter layer. The micro-lens layer may include a respective micro-lens for each of the plurality of octagon-shaped pixel sensors 202 and the plurality of square-shaped pixel sensors 204 included in the pixel array 200.

Although FIG. 32 shows example blocks of process 3200, in some implementations, process 3200 may include additional blocks, fewer blocks, different blocks, or differently arranged blocks than those depicted in FIG. 32. Additionally, or alternatively, two or more of the blocks of process 3200 may be performed in parallel.

In this way, a pixel array includes octagon-shaped pixel sensors and square-shaped pixel sensors. The octagon-shaped pixel sensors may be interspersed in the pixel array with square-shaped pixel sensors to increase the utilization of space in the pixel array, and to allow for pixel sensors in the pixel array to be sized differently. Moreover, the pixel array may include a combination of red, green, and blue pixel sensors to obtain color information from incident light; yellow pixel sensors for blue and green color enhancement and correction for the pixel array; NIR pixel sensors to increase contour sharpness and low light performance for the pixel array; and/or white pixel sensors to increase light sensitivity and brightness for the pixel array. The capability to configure different sizes and types of pixel sensors permits the pixel array to be formed and/or configured to satisfy various performance parameters, such as color saturation, color accuracy, noise, contrast, brightness, hue and saturation, light sensitivity, and contour sharpness.

As described in greater detail above, some implementations described herein provide a pixel array. The pixel array includes a plurality of octagon-shaped pixel sensors, including a first set of octagon-shaped pixel sensors configured to sense incident light in a first visible light wavelength range associated with blue light, a second set of octagon-shaped pixel sensors configured to sense incident light in a second visible light wavelength range associated with red light, and a third set of octagon-shaped pixel sensors configured to sense incident light in a third visible light wavelength range associated with green light. The pixel array includes a plurality of square-shaped pixel sensors, including at least one of a first set of square-shaped pixel sensors configured to sense incident light in a fourth visible light wavelength range associated with yellow light, a second set of square-shaped pixel sensors configured to sense incident light for all visible light wavelengths, or a third set of square-shaped pixel sensors configured to sense incident light in a NIR wavelength range. Each square-shaped pixel sensor of at least a subset of the plurality of square-shaped pixel sensors is disposed between a respective subset of the plurality of octagon-shaped pixel sensors.

As described in greater detail above, some implementations described herein provide a pixel array. The pixel array includes a plurality of square-shaped pixel sensors. A first set of square-shaped pixel sensors are configured to sense incident light in a first visible light wavelength range associated with blue light, a second set of square-shaped pixel sensors are configured to sense incident light in a second visible light wavelength range associated with red light, and a third set of square-shaped pixel sensors are configured to sense incident light in a third visible light wavelength range associated with green light. The pixel array includes a plurality of octagon-shaped pixel sensors, including at least one of a first set of octagon-shaped pixel sensors configured to sense incident light in a fourth visible light wavelength range associated with yellow light, a second set of octagon-shaped pixel sensors configured to sense incident light for all visible light wavelengths, or a third set of octagon-shaped pixel sensors configured to sense incident light in an NIR wavelength range. Each square-shaped pixel sensor of at least a subset of the plurality of square-shaped pixel sensors is disposed between a respective subset of the plurality of octagon-shaped pixel sensors.

As described in greater detail above, some implementations described herein provide a method. The method includes forming a plurality of octagon-shaped pixel sensors of a pixel array to include a first set of octagon-shaped pixel sensors configured to sense incident light in a first visible light wavelength range associated with blue light, a second set of octagon-shaped pixel sensors configured to sense incident light in a second visible light wavelength range associated with red light, a third set of octagon-shaped pixel sensors configured to sense incident light in a third visible light wavelength range associated with green light, and at least one of a fourth set of octagon-shaped pixel sensors configured to sense incident light in a fourth visible light wavelength range associated with yellow light, a fifth set of octagon-shaped pixel sensors configured to sense incident light for all visible light wavelengths, or a sixth set of octagon-shaped pixel sensors configured to sense incident light in a NIR wavelength range. The method includes forming a plurality of square-shaped pixel sensors, interspersed with the plurality of octagon-shaped pixel sensors in the pixel array, to include a first set of square-shaped pixel sensors configured to sense incident light in the first visible light wavelength range associated with blue light, a second set of square-shaped pixel sensors configured to sense incident light in the second visible light wavelength range associated with red light, a third set of square-shaped pixel sensors configured to sense incident light in the third visible light wavelength range associated with green light, and at least one of a fourth set of square-shaped pixel sensors configured to sense incident light in the fourth visible light wavelength range associated with yellow light, a fifth set of square-shaped pixel sensors configured to sense incident light for all visible light wavelengths, or a sixth set of square-shaped pixel sensors configured to sense incident light in the NIR wavelength range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
   a plurality of octagon-shaped pixel sensors, comprising:
   a first set of octagon-shaped pixel sensors configured to sense incident light in a first visible light wavelength range associated with blue light;
   a second set of octagon-shaped pixel sensors configured to sense incident light in a second visible light wavelength range associated with red light; and
   a third set of octagon-shaped pixel sensors configured to sense incident light in a third visible light wavelength range associated with green light; and
   a plurality of square-shaped pixel sensors, disposed between and in contact with the plurality of octagon-shaped pixel sensors, comprising:
   a first set of square-shaped pixel sensors configured to sense incident light in a fourth visible light wavelength range associated with yellow light;
   a second set of square-shaped pixel sensors configured to sense incident light in a near infrared (NIR) wavelength range; and
   a third set of square-shaped pixel sensors configured to sense incident light in a fourth visible wavelength range associated with white light,
   wherein an entire length of each side of each of the plurality of square-shaped pixel sensors is in contact with, and aligns with, an entire length of a side of a different one of a set of the plurality of octagon-shaped pixel sensors, and
   wherein at least one of the plurality of octagon-shaped pixel sensors is in contact with:
   another one of the plurality of octagon-shaped pixel sensors, and
   at least one of the plurality of square-shaped pixel sensors.

2. The pixel array of claim 1, wherein the plurality of octagon-shaped pixel sensors further comprises a fifth set of octagon-shaped pixel sensors configured to sense incident light in the fourth visible light wavelength range associated with yellow light.

3. The pixel array of claim 1, wherein the plurality of octagon-shaped pixel sensors further comprises a fifth set of octagon-shaped pixel sensors configured to sense incident light for all visible light wavelengths.

4. The pixel array of claim 1, wherein the plurality of octagon-shaped pixel sensors further comprises a fourth set of octagon-shaped pixel sensors configured to sense incident light in the NIR wavelength range.

5. The pixel array of claim 1, wherein the plurality of octagon-shaped pixel sensors further comprises:
   a fifth set of octagon-shaped pixel sensors configured to sense incident light in the fourth visible light wavelength range associated with yellow light; and
   a sixth set of octagon-shaped pixel sensors configured to sense incident light for all visible light wavelengths.

6. The pixel array of claim 1, wherein the plurality of octagon-shaped pixel sensors further comprises:
   a fourth set of octagon-shaped pixel sensors configured to sense incident light in the NIR wavelength range; and
   a fifth set of octagon-shaped pixel sensors configured to sense incident light in the fourth visible light wavelength range associated with yellow light.

7. The pixel array of claim 1, wherein the plurality of octagon-shaped pixel sensors further comprises:
   a fourth set of octagon-shaped pixel sensors configured to sense incident light in the NIR wavelength range; and
   a fifth set of octagon-shaped pixel sensors configured to sense incident light for all visible light wavelengths.

8. The pixel array of claim 1, wherein the plurality of octagon-shaped pixel sensors further comprises:
   a fourth set of octagon-shaped pixel sensors configured to sense incident light in the NIR wavelength range;
   a fifth set of octagon-shaped pixel sensors configured to sense incident light in the fourth visible light wavelength range associated with yellow light; and
   a sixth set of octagon-shaped pixel sensors configured to sense incident light for all visible light wavelengths.

9. A pixel array, comprising:
   a plurality of square-shaped pixel sensors, comprising:
   a first set of square-shaped pixel sensors configured to sense incident light in a first visible light wavelength range associated with blue light;
   a second set of square-shaped pixel sensors configured to sense incident light in a second visible light wavelength range associated with red light; and
   a third set of square-shaped pixel sensors configured to sense incident light in a third visible light wavelength range associated with green light; and
   a plurality of octagon-shaped pixel sensors, disposed between and in contact with the plurality of square-shaped pixel sensors, comprising:
   a first set of octagon-shaped pixel sensors configured to sense incident light for all visible light wavelengths;
   a second set of octagon-shaped pixel sensors configured to sense incident light in a near infrared (NIR) wavelength range;
   a third set of octagon-shaped pixel sensors configured to sense incident light in a third visible light wavelength range associated with yellow light; and
   a fourth set of octagon-shaped pixel sensors configured to sense incident light in a fourth visible light wavelength range associated with white light,
   wherein an entire length of each side of each of the plurality of square-shaped pixel sensors is in contact with, and aligns with, an entire length of a side of a different one of a set of the plurality of octagon-shaped pixel sensors, and
   wherein at least one of the plurality of octagon-shaped pixel sensors is in contact with:
   another one of the plurality of octagon-shaped pixel sensors, and
   at least one of the plurality of square-shaped pixel sensors.

10. The pixel array of claim 9, wherein the plurality of square-shaped pixel sensors further comprises a fifth set of square-shaped pixel sensors configured to sense incident light in a fourth visible light wavelength range associated with yellow light.

11. The pixel array of claim 9, wherein the plurality of square-shaped pixel sensors further comprises a fifth set of square-shaped pixel sensors configured to sense incident light for all visible light wavelengths.

12. The pixel array of claim 9, wherein the plurality of square-shaped pixel sensors further comprises a fourth set of square-shaped pixel sensors configured to sense incident light in the NIR wavelength range.

13. The pixel array of claim 9, wherein the plurality of square-shaped pixel sensors further comprises:
   a fifth set of square-shaped pixel sensors configured to sense incident light in a fourth visible light wavelength range associated with yellow light; and a sixth set of square-shaped pixel sensors configured to sense incident light for all visible light wavelengths.

14. The pixel array of claim 9, wherein the plurality of square-shaped pixel sensors further comprises:
 a fourth set of square-shaped pixel sensors configured to sense incident light in the NIR wavelength range; and
 a fifth set of square-shaped pixel sensors configured to sense incident light in a fourth visible light wavelength range associated with yellow light.

15. The pixel array of claim 9, wherein the plurality of square-shaped pixel sensors further comprises:
 a fourth set of square-shaped pixel sensors configured to sense incident light in the NIR wavelength range; and
 a fifth set of square-shaped pixel sensors configured to sense incident light for all visible light wavelengths.

16. The pixel array of claim 9, wherein the plurality of square-shaped pixel sensors further comprises:
 a fourth set of square-shaped pixel sensors configured to sense incident light in the NIR wavelength range;
 a fifth set of square-shaped pixel sensors configured to sense incident light in a fourth visible light wavelength range associated with yellow light; and
 a sixth set of square-shaped pixel sensors configured to sense incident light for all visible light wavelengths.

17. A method, comprising:
 forming a plurality of octagon-shaped pixel sensors of a pixel array to include:
  a first set of octagon-shaped pixel sensors configured to sense incident light in a first visible light wavelength range associated with blue light,
  a second set of octagon-shaped pixel sensors configured to sense incident light in a second visible light wavelength range associated with red light,
  a third set of octagon-shaped pixel sensors configured to sense incident light in a third visible light wavelength range associated with green light,
  a fourth set of octagon-shaped pixel sensors configured to sense incident light for all visible light wavelengths, and
  a fifth set of octagon-shaped pixel sensors configured to sense incident light in a near infrared (NIR) wavelength range; and
 forming a plurality of square-shaped pixel sensors, disposed between and in contact with the plurality of octagon-shaped pixel sensors in the pixel array, to include:
  a first set of square-shaped pixel sensors configured to sense incident light in the first visible light wavelength range associated with the blue light,
  a second set of square-shaped pixel sensors configured to sense incident light in the second visible light wavelength range associated with the red light,
  a third set of square-shaped pixel sensors configured to sense incident light in the third visible light wavelength range associated with the green light,
  a fourth set of square-shaped pixel sensors configured to sense incident light for all visible light wavelengths, and
  a fifth set of square-shaped pixel sensors configured to sense incident light in the NIR wavelength range,
  wherein an entire length of each side of each of the plurality of square-shaped pixel sensors is in contact with, and aligns with, an entire length of a side of a different one of a set of the plurality of octagon-shaped pixel sensors, and
  wherein at least one of the plurality of octagon-shaped pixel sensors is in contact with:
   another one of the plurality of octagon-shaped pixel sensors, and
   at least one of the plurality of square-shaped pixel sensors.

18. The method of claim 17, wherein forming the plurality of square-shaped pixel sensors comprises:
 forming the plurality of square-shaped pixel sensors to include a fourth set of square-shaped pixel sensors configured to sense incident light in a fourth visible light wavelength range associated with yellow light,
 wherein a quantity, of the fourth set of square-shaped pixel sensors configured to sense incident light in the fourth visible light wavelength range associated with yellow light, satisfies a blue light performance parameter and a green light performance parameter.

19. The method of claim 17, wherein at least one of: forming the plurality of octagon-shaped pixel sensors comprises:
 forming the plurality of octagon-shaped pixel sensors to include a quantity, of the fourth set of octagon-shaped pixel sensors configured to sense incident light for all visible light wavelengths, that satisfies a sensitivity parameter and a brightness parameter, or
 forming the plurality of square-shaped pixel sensors comprises:
 forming the plurality of square-shaped pixel sensors to include a quantity, of the fourth set of square-shaped pixel sensors configured to sense incident light for all visible light wavelengths, that satisfies the sensitivity parameter and the brightness parameter.

20. The method of claim 17, wherein at least one of:
 forming the plurality of octagon-shaped pixel sensors comprises:
 forming the plurality of octagon-shaped pixel sensors to include a quantity, of the fifth set of octagon-shaped pixel sensors configured to sense incident light in the NIR wavelength range, that satisfies a low light performance parameter and a contour sharpness parameter, or
 forming the plurality of square-shaped pixel sensors comprises:
 forming the plurality of square-shaped pixel sensors to include a quantity, of the fifth set of square-shaped pixel sensors configured to sense incident light in the NIR wavelength range, that satisfies the low light performance parameter and the contour sharpness parameter.

* * * * *